(12) United States Patent
Takao

(10) Patent No.: US 7,084,506 B2
(45) Date of Patent: Aug. 1, 2006

(54) SEMICONDUCTOR DEVICE

(75) Inventor: Yoshihiro Takao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 168 days.

(21) Appl. No.: 10/947,204

(22) Filed: Sep. 23, 2004

(65) Prior Publication Data

US 2005/0253267 A1    Nov. 17, 2005

(30) Foreign Application Priority Data

May 13, 2004    (JP)    ............................. 2004-143245

(51) Int. Cl.
*H01L 23/48*    (2006.01)
(52) U.S. Cl. ............................. 257/758; 257/E21.682; 257/E27.103; 257/E29.129
(58) Field of Classification Search ........ 257/E21.682, 257/E27.103, E29.129, 758; 365/182, 185, 365/189.03, 230.04
See application file for complete search history.

(56) References Cited

U.S. PATENT DOCUMENTS 5,278,785 A * 1/1994 Hazani ................. 365/185.16
6,400,592 B1   6/2002 Peterson

FOREIGN PATENT DOCUMENTS

JP    9-148440    6/1997
WO    WO 02/21536    3/2002

* cited by examiner

*Primary Examiner*—Mai-Huong Tran
(74) *Attorney, Agent, or Firm*—Westerman, Hattori, Daniels & Adrian, LLP.

(57) ABSTRACT

The semiconductor device comprises logic blocks 12 forming a logic circuit, and interconnection regions 14. A gate interconnection 32a including the gate electrode of a load transistor L1 and the gate electrode of a driver transistor D1, and the source/drain diffused layer 38 of a load transistor L2 are connected to each other by a conductor plug 50b. A gate interconnection 32b including the gate electrode of a load transistor L2 and the gate electrode of a driver transistor D2, and the source/drain diffused layer 35 of the load transistor L1 are connected to each other by a conductor plug 50c. The source/drain diffused layer 37 of a transfer transistor T1 and the source/drain diffused layer 37 of the first driver transistor D1 are made common, and the source/drain diffused layer 40 of the transfer transistor T2 and the source/drain diffused layer 40 of the driver transistor D2 are made common. Accordingly, the area for the memory cells to be formed in can be made very small. The memory cells having such layout are used as the memory cells of the logic blocks and the switch matrices, whereby the areas for the logic blocks to be formed in and the switch matrices to be formed in can be made small. Thus, it is possible to contribute to downsing, high integration and large capacity, etc. of semiconductor devices.

16 Claims, 20 Drawing Sheets

US 7,084,506 B2

SEMICONDUCTOR DEVICE

CROSS-REFERENCE TO RELATED APPLICATION

This application is based upon and claims priority of Japanese Patent Application No. 2004-143245, filed on May 13, 2004, the contents being incorporated herein by reference.

BACKGROUND OF THE INVENTION

The present invention relates to a semiconductor device especially including SRAM cells.

FPGA (Field Programmable Gate Array) is an LSI which can be programmed freely by users in fields.

FPGA comprises a logic block (variable logic block) for performing a desired logical function, based on data set in the memory cells, and an interconnection region (variable interconnection region) for setting a desired interconnection path, based on the data set in the memory cells.

The memory cells provided in the logic blocks and the interconnection regions are, e.g., SRAM cells.

The SRAM cells provided in the proposed FPGA will be explained with reference to FIG. 20. FIG. 20 is a plan view of an SRAM cell of the proposed semiconductor device.

As illustrated in FIG. 20, a p-type well 122 and an n-type well 124 are formed on a semiconductor substrate. A device isolation region 128 for defining the device regions 126a, 126b is formed on the semiconductor substrate with the p-type well 122 and the n-type well 124 formed on. Gate interconnections 132a–132c are formed on the semiconductor substrate with a gate insulation film (not illustrated) formed therebetween.

The gate interconnection 132a is formed in a T-shape and crosses the device region 126a. The gate interconnection 132a includes the gate electrode of a load transistor L1 and the gate electrode of a driver transistor D1 and commonly connects the gate electrode of the load transistor L1 and the gate electrode of the driver transistor D1. In the device region 126a on both side of the gate electrode 132a, a p-type source diffused layer 134, 135 is formed. The gate electrode 132a and the source/drain diffused layer 134, 135 constitute the load transistor L1. In the device region 126a on both sides of the gate electrode 132a, an n-type source/drain diffused layer 136, 137 is formed. The gate electrode 126a and the source/drain diffused layer 136, 137 constitute the driver transistor D1.

The gate interconnection 132b is formed in a T-shape and crosses the device region 126b. The gate interconnection 132b includes the gate electrode of a load transistor L2 and the gate electrode of the driver transistor D2 and commonly connects the gate electrode of load transistor L2 and the gate electrode of the driver transistor D2. In the device region 126b on both sides for the gate electrode 132b, the p-type source/drain diffused layer 138, 139 is formed. The gate electrode 132b and the source/drain diffused layer 138, 139 constitute a load transistor L2. In the device region 126b on both sides of the gate electrode 132b, then-type source/drain diffused layer 140, 141 is formed. The gate electrode 132b and the source/drain diffused layer 140, 141 constitute a driver transistor D2.

The gate interconnection 132c is formed linearly and crosses the device regions 126a, 126b. The gate interconnection 132c includes the gate electrode of a transfer transistor T1 and the gate electrode of a transfer transistor T2 and commonly connects the gate electrode of the transfer transistor T1 and the gate electrode of the transfer transistor T2. In the device region 126a on both sides of the gate electrode 132c, the source/drain diffused layer 137, 142 is formed. The gate electrode 132c and the source/drain diffused layer 137, 142 constitute a transfer transistor T1. In the device region 126b on both sides of the gate electrode 132c, the source/drain diffused layer 140, 143 is formed. The gate electrode 132c and the source/drain diffused layer 140, 143 constitute the transfer transistor T2.

These transistors L1, L2, D1, D2, T1, T2 are connected to a source voltage, earth voltage, bit lines, etc. via a conductor plug 150, etc.

The SRAM cell of the proposed semiconductor substrate is thus constituted.

Following references disclose the background art of the present invention.

[Patent Reference 1]
Specification of Japanese Patent Application Unexamined Publication No. Hei 9-148440
[Patent Reference 2]
Specification of U.S. Pat. No. 6,400,592

SUMMARY OF THE INVENTION

According to one aspect of the present invention, there is provided a semiconductor device comprising a plurality of memory cells each of which comprises a first inverter including a first load transistor and a first driver transistor, a second inverter including a second load transistor and a second driver transistor, a first transfer transistor for controlling the first inverter and the second inverter, and a second transfer transistor for controlling the first inverter and the second inverter; a logic block forming a logical circuit, based data set in said plurality of memory cells; and an interconnection region connected to the logic block, the semiconductor device comprising: a first gate interconnection including the gate electrode of the first load transistor and the gate electrode of the first driver transistor, the first gate interconnection being formed linearly and reached to a vicinity of the source/drain diffused layer of the second load transistor; a second gate interconnection including the gate electrode of the second load transistor and the gate electrode of the second driver transistor, the second gate interconnection being formed linearly and reached to a vicinity of source/drain diffused layer of the first load transistor; a third gate interconnection including the gate electrode of the first transfer transistor, the third gate interconnection being positioned on an extension of the second gate interconnection; a fourth gate interconnection including the gate electrode of the second transfer transistor, the fourth gate interconnection being positioned on an extension of the first gate interconnection; a first conductor plug contacting the first gate interconnection and the source/drain diffused layer of the second load transistor; and a second conductor plug contacting the second gate interconnection and the source/drain diffused layer of the first load transistor, one of the source/drain diffuse layer of the first transfer transistor, and one of the source/drain diffused layer of the first driver transistor being formed of the common source/drain diffused layer.

According to the present invention, the memory cells in each logic block and in each switch matrix are SRAM cells each including 6 transistors. The first gate interconnection including the gate electrode of the first load transistor and the gate electrode of the first driver transistor is formed linearly, arriving at a vicinity of the source/drain diffused layer of a second load transistor. The second gate interconnection including the gate electrode of the second load transistor and the gate electrode of the second driver transistor is formed linearly, arriving at a vicinity of the source/drain diffused layer of the first load transistor. The third gate interconnection including the gate electrode of a first transfer transistor is positioned on an extension of the second gate interconnection. The fourth gate interconnection including the gate electrode of the second transfer transistor is positioned on an extension of the first gate interconnection. The first gate interconnection and the source/drain diffused layer of the second load transistor are connected to each other by a first conductor plug. The second gate interconnection and the source/drain diffused layer of the first load transistor are connected to each other by a second conductor plug. The source/drain diffused layer of the first transfer transistor and the source/drain diffused layer of the first driver transistor are formed of the common source/drain diffused layer. The source/drain diffused layer of the second transfer transistor and the source/drain diffused layer of the second driver transistor are formed of the common source/drain diffused layer. Accordingly, the area for the memory cells to be formed in can be made very small. In the present invention, the memory cells having such layout are used as the memory cells of the logic blocks and the switch matrices, whereby the areas for the logic blocks to be formed in and the switch matrices to be formed in can be made small. Thus, the present invention can contribute to down-sing, high integration, large capacity, etc. of semiconductor devices.

DETAILED DESCRIPTION OF THE INVENTION

One Embodiment

Figure 1:
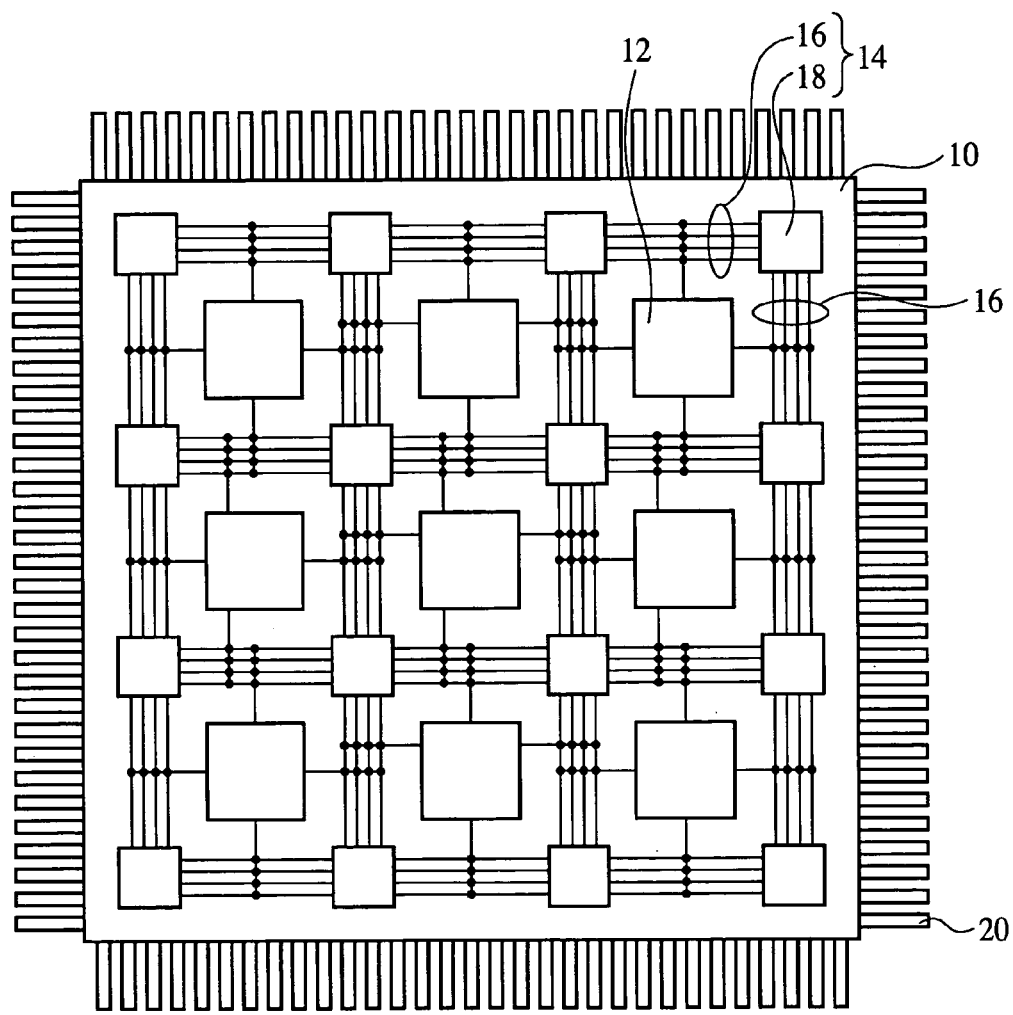
FIG. 1 is a conceptual view of the semiconductor device according to one embodiment of the present invention, which illustrates a general structure thereof.
Figure 2:
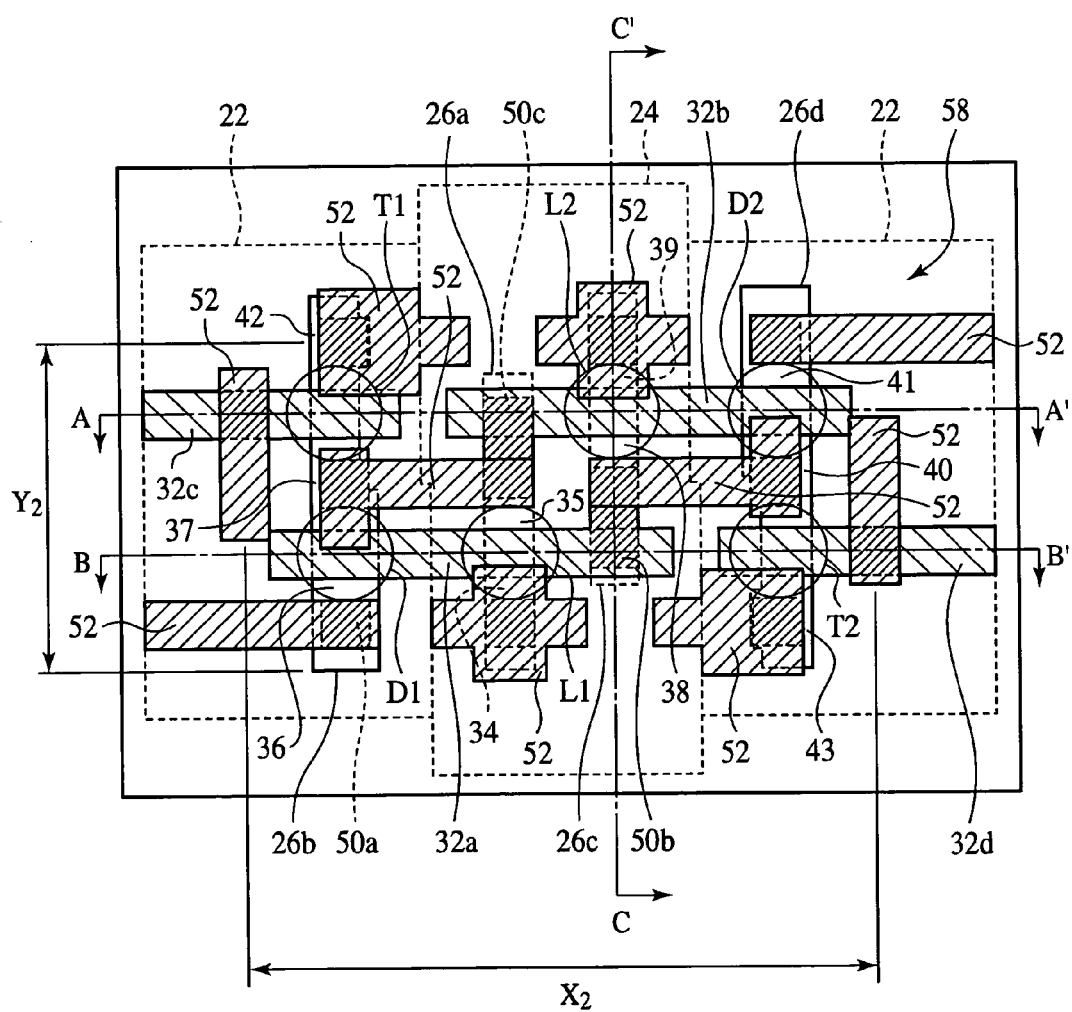
FIG. 2 is a plan view of the semiconductor device according to the embodiment of the present invention (Part 1).
Figure 3:
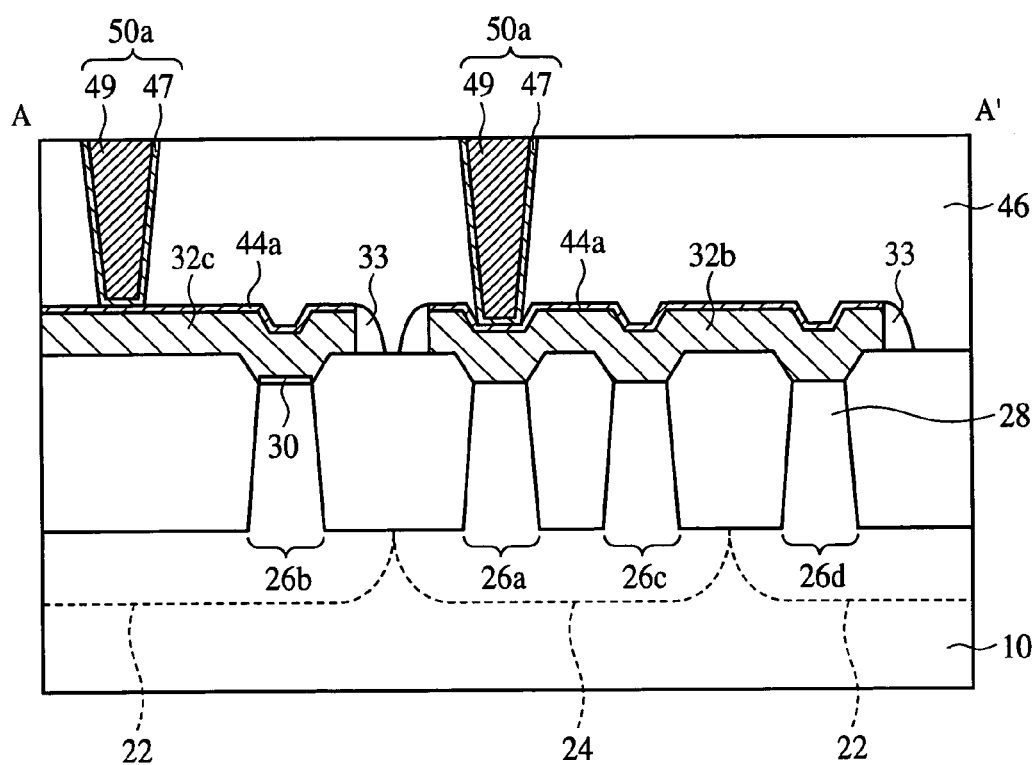
FIG. 3 is a sectional view of the semiconductor device according to the embodiment of the present invention (Part 1).
Figure 4:
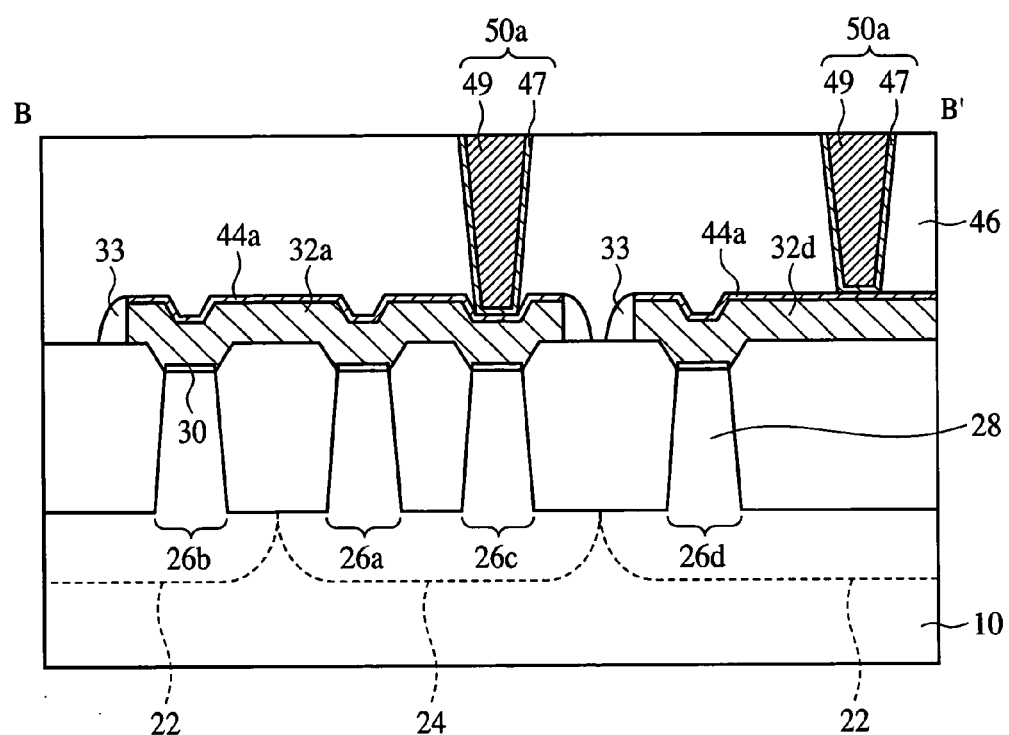
FIG. 4 is a sectional view of the semiconductor device according to the embodiment of the present invention (Part 2).
Figure 5:
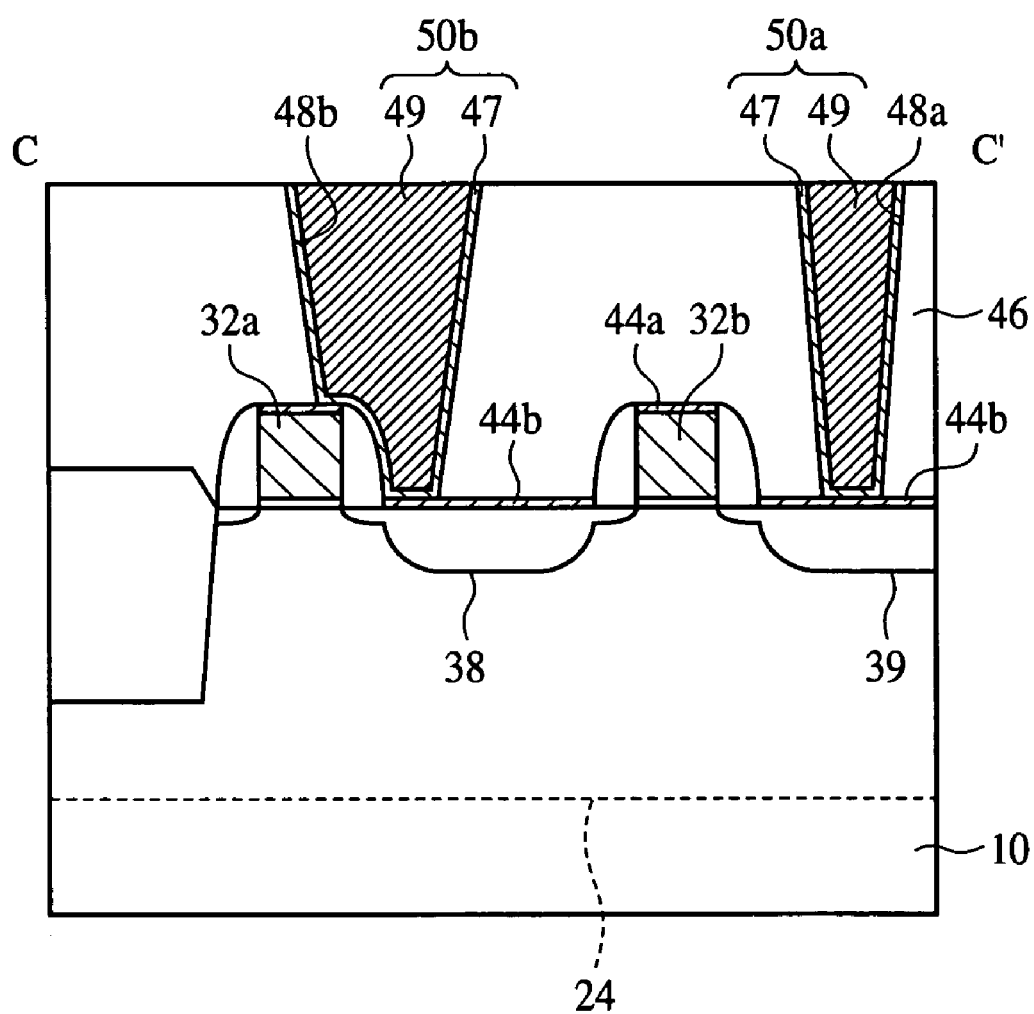
FIG. 5 is a sectional view of the semiconductor device according to the embodiment of the present invention (Part 3).
Figure 6:
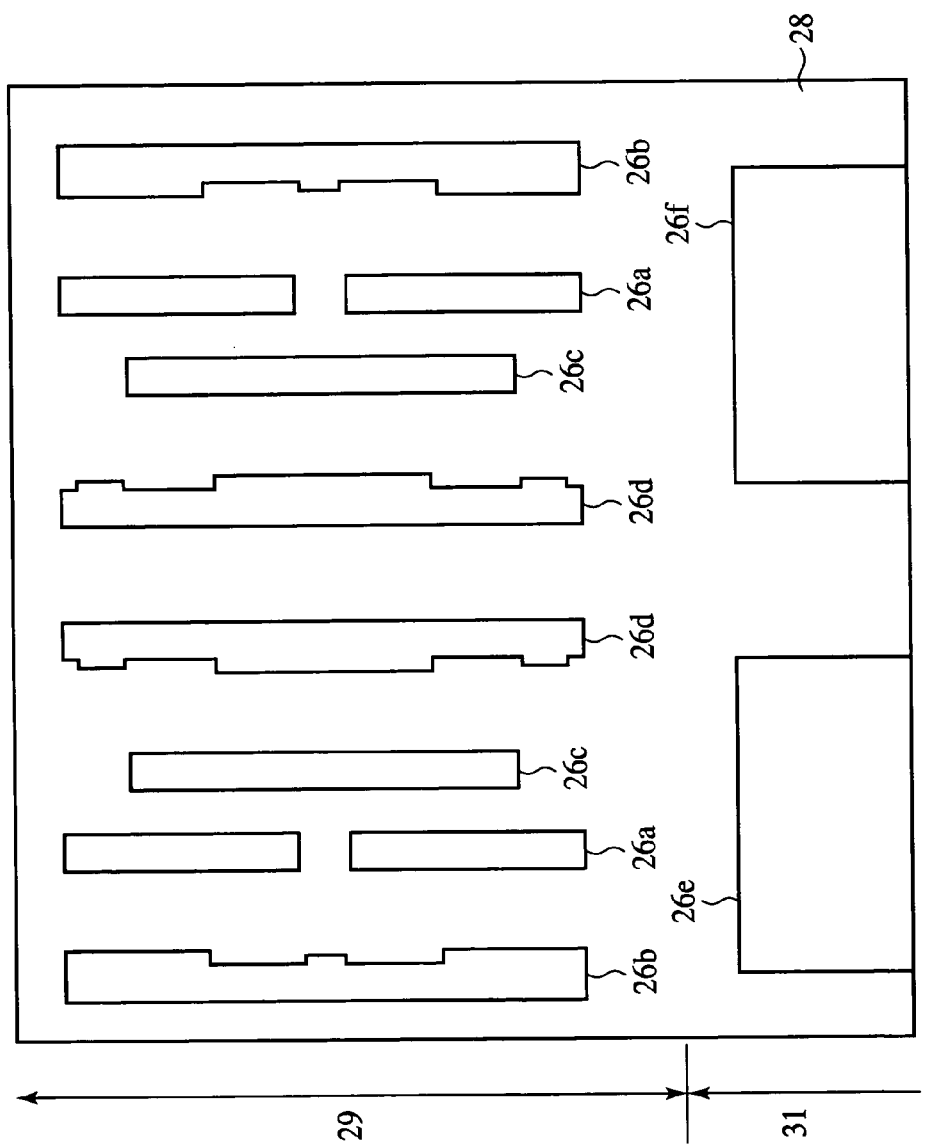
FIG. 6 is a plan view of the semiconductor device according to the embodiment of the present invention (Part 2).
Figure 7:
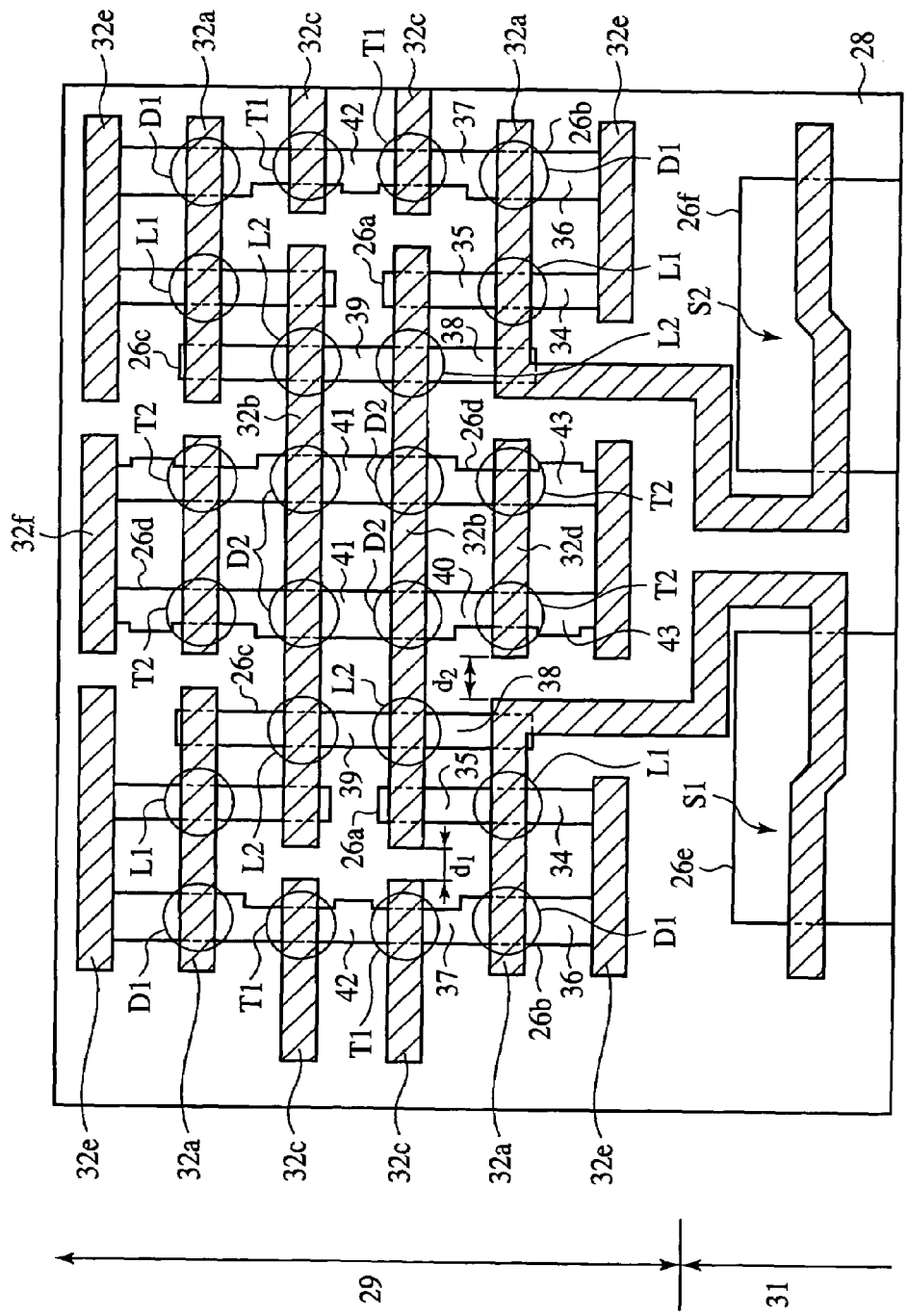
FIG. 7 is a plan view of the semiconductor device according to the embodiment of the present invention (Part 3).
Figure 8:
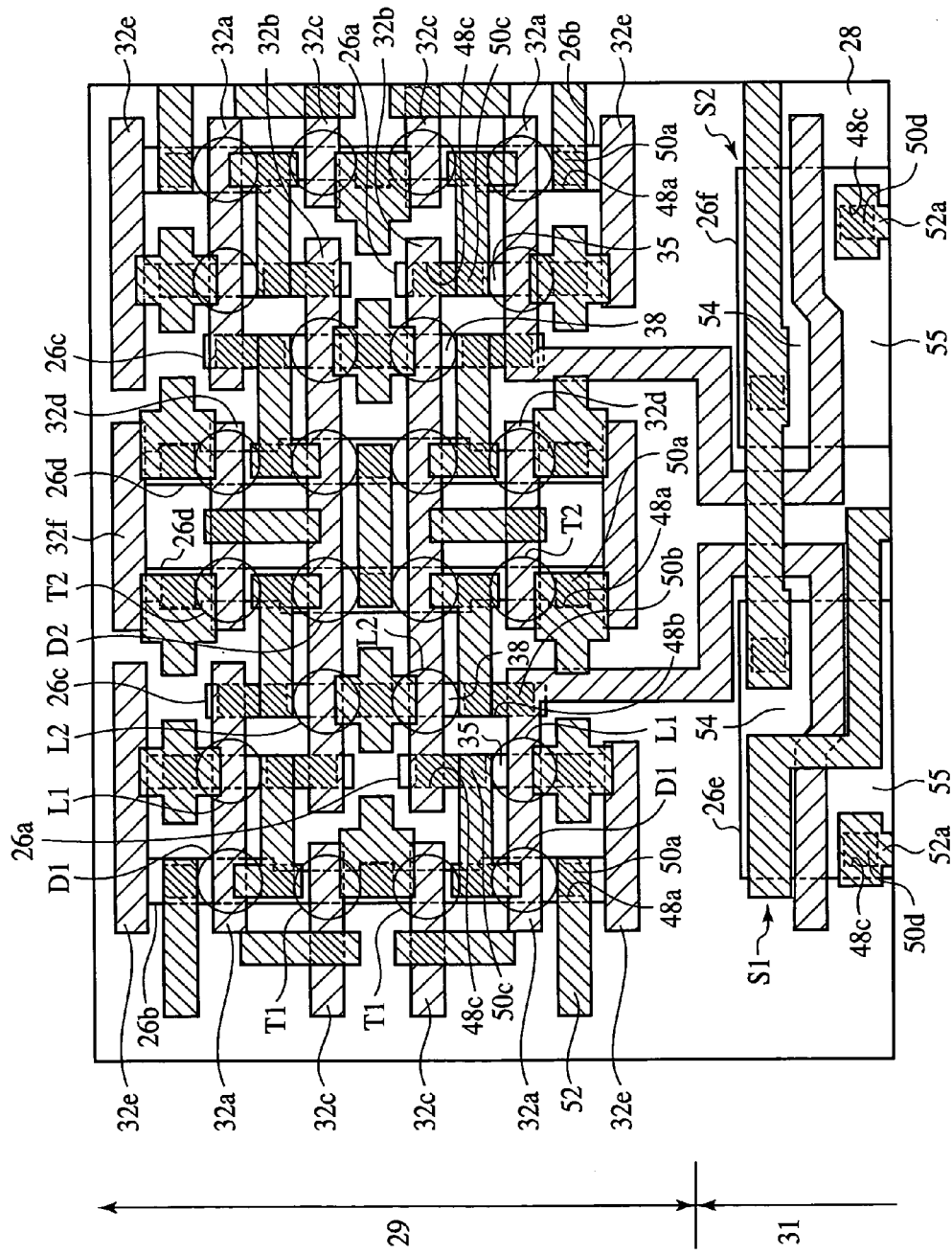
FIG. 8 is a plan view of the semiconductor device according to the embodiment of the present invention (Part 4).
Figure 9:
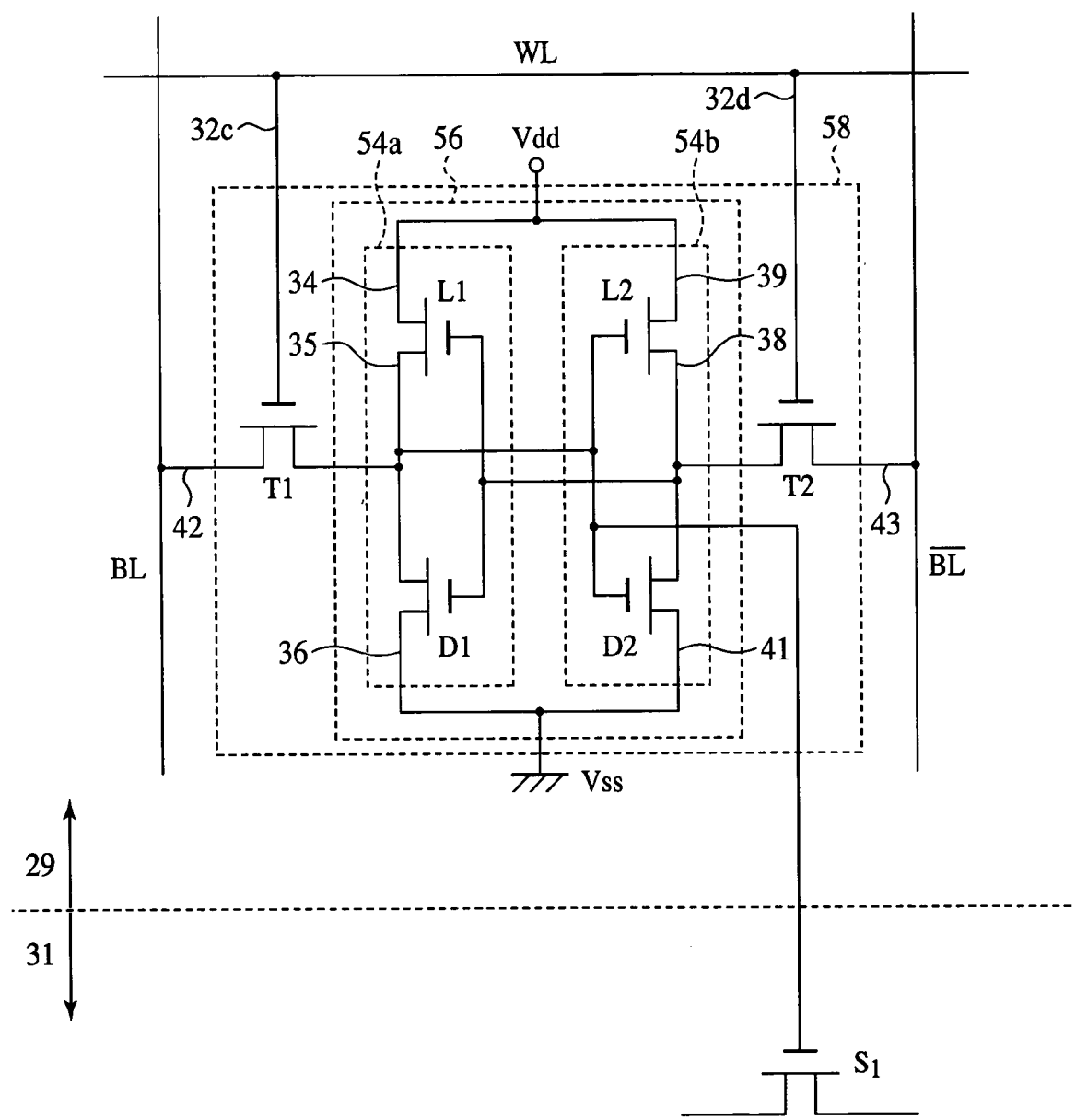
FIG. 9 is a circuit diagram of the semiconductor device according to the embodiment of the present invention.
Figure 10:
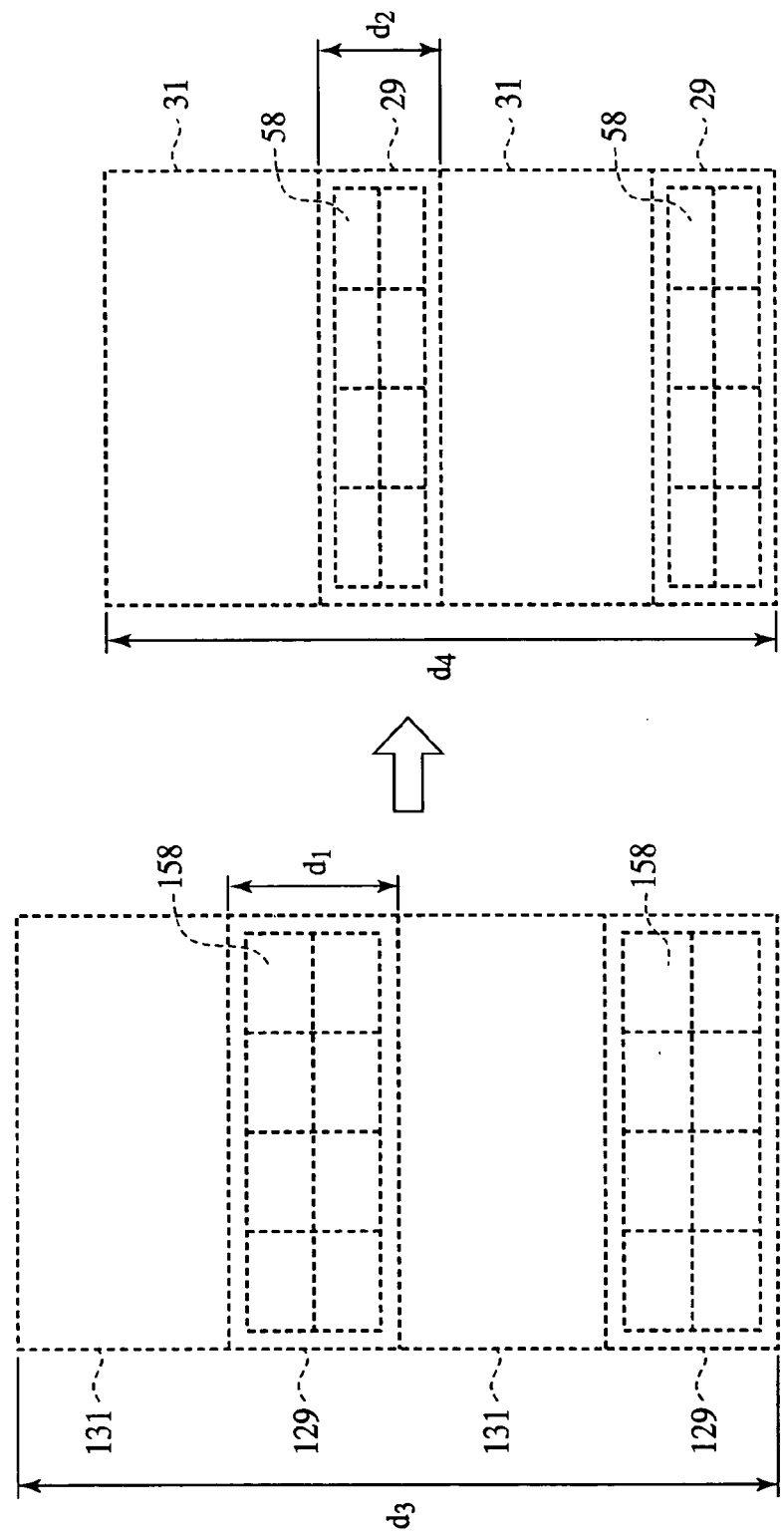
FIG. 10 is conceptual views of a layout of the logic blocks of the semiconductor device according to the embodiment of the present invention.

The semiconductor device according to one embodiment of the present invention and the method for fabricating the semiconductor device will be explained with reference to FIGS. 1 to 19. FIG. 1 is a conceptual view of the semiconductor device according to the present embodiment, which illustrates a general structure thereof. FIG. 2 is a plan view (Part 1) of the semiconductor device according to the present embodiment. FIGS. 3 to 5 are sectional views of the semiconductor device according to the present embodiment in the steps of the method for fabricating the semiconductor device, which illustrate the method. FIG. 3 is the sectional view along the line A—A' in FIG. 2. FIG. 4 is the sectional view along the line B—B' in FIG. 2. FIG. 5 is the sectional view along the line C—C' in FIG. 2. FIGS. 6 to 8 are plan views of the semiconductor device according to the present embodiment (Parts 2 to 4). FIG. 9 is a circuit diagram of the semiconductor device according to the present embodiment. FIG. 10 is a conceptual view of a layout of the logic block of the semiconductor device according to the present embodiment.

In the present embodiment, the present invention is applied to FPGA. However, the present invention is applicable to not only FPGA, but also any other semiconductor device.

(The Semiconductor Device)

As illustrated in FIG. 1, a plurality of logic blocks 12 are provided in a matrix on a semiconductor chip 10. In each logic block 12, a look up table (LUT, not illustrated), a selector (not illustrated), a flip-flop (not illustrated), etc. are formed. In the LUT and the selector, memory cells (program elements) are provided. The logic blocks 12 perform the logical function, based on data set in the memory cells. The memory cells are SRAM cells which will be described later.

Between the logic blocks 12 there are provided interconnection regions 14 for interconnecting the logic blocks 12 with each other. Each interconnection region 14 comprises a plurality of interconnections 16 extended row-wise and column-wise, and a switch matrix 18 for setting interconnection paths. The switching matrix 18 comprises a combination of a plurality of transistor switches (not illustrated). Each transistor switch is connected to the memory cell. The memory cells are SRAM cells which will be described later. The structure of the SRAM cells provided in the switch matrixes 18 and the structure of the SRAM cells provided in the logic blocks 12 are the same. The transistor switches are turned on and off, based on data set in the memory cells. The transistor switches provided in the switch matrixes 18 are turned suitably on and off to thereby suitably set interconnection paths.

The semiconductor chip 10 is molded with a resin (not illustrated). A plurality leads 20 are provided at the edge of the package.

As illustrated in FIG. 2, p-type wells 22 and an n-type well 24 are formed on the semiconductor substrate 10 of, e.g., p-type silicon. The up-to-down (as viewed in the drawing) length of the n-type well 24 is larger than the up-to-down (as viewed in the drawing) length of the p-type wells 22. The up-to-down (as viewed in the drawing) length of the n-type well 24 is thus set so as to satisfy design rules.

As illustrated in FIGS. 3 to 5, device isolation regions 28 for defining device regions 26a–26d are formed on the semiconductor substrate 10 with the p-type wells 22 and the n-type well 24 formed on.

On the semiconductor substrate 10, gate interconnections 32a–32d of, e.g., polysilicon are formed with a gate insulation film 30 formed therebetween. The gate interconnection 32a is formed substantially linearly. The gate interconnection 32b is formed substantially in parallel with the gate interconnection 32a. The gate interconnection 32b is arranged at a position which is offset from the gate interconnection 32a in a right direction as viewed in the drawing. The gate interconnection 32c is formed substantially in parallel with the gate interconnection 32a. The gate interconnection 32c is arranged at a position which is offset from the gate interconnection 32a in a left direction as viewed in the drawing. The center line of the gate interconnection 32c is in agreement with the center line of the gate interconnection 32b. The gate interconnection 32d is formed substantially in parallel with the gate interconnection 32b. The gate interconnection 32d is arranged at a position which is offset from the gate interconnection 32b in a right direction as viewed in the drawing. The center line of the gate interconnection 32d is in agreement with the center line of the gate interconnection 32a.

As illustrated in FIG. 7, dummy patterns 32e are formed substantially in parallel with the gate interconnections 32a at the peripheral part of the memory cell 29 with the memory cells formed in. At the peripheral part of the memory cell region 29, dummy patterns 32f are formed substantially in parallel with the gate interconnection 32d. The dummy patterns 32e, 32f are formed of one and the same conduction film as the gate interconnection 32a–32d.

The dummy patterns 32a, 32f are formed substantially in parallel with the gate interconnections 32a, 32d for the following reason. That is, when the interconnection patterns for forming the gate interconnections 32a–32d is simply exposed on a photoresist film, the exposure much varies among the interconnection patterns positioned at the peripheral part of the memory cell region 29 and the interconnection patterns positioned at the inner part of the memory cell region 29. Then, the thickness of the interconnections positioned at the peripheral part of the memory cell region 29 and the thickness of the interconnection patterns positioned at the inner part of the memory cell region 29 differ from each other, which makes the electric characteristics of the transistors disuniform.

In the present embodiment, the presence of the dummy patterns 32e, 32f formed at the peripheral part of the memory cell region 29 prevents the thickness of the interconnection patterns positioned at the peripheral part of the memory cell region 29 and the thickness of the interconnection patterns positioned at the inner part of the memory cell region 29 from differing from each other. Thus, according to the present embodiment, disuniformity the electric characteristics of the transistors can be prevented.

Here, the dummy patterns 32e, 32f are formed along the gate interconnection 32a and the gate interconnection 32d, which are positioned at the peripheral part of the memory cell region 29, but when the gate interconnections 32b, 32c are positioned at the peripheral part of the memory cell region 29, the dummy patterns may be formed along the gate interconnections 32b, 32c.

A sidewall insulation film 33 is formed on the side walls of the gate interconnections 32a–32d.

The gate interconnection 32a is formed, crossing the device regions 26a, 26b. The gate interconnection 32a includes the gate electrode of a load transistor L1 and the gate electrode of a driver transistor D1, and commonly connects the gate electrode of the load transistor L1 and the gate electrode of the driver transistor D1. The gate interconnection 32a is extended up to a vicinity of the source/drain diffused layer 38 of a load transistor L2 formed in the device region 26c.

As illustrated in FIG. 7, in the device region 26a on both sides of the gate interconnection 32a, a source/drain diffused layer 34, 35 is formed. The gate electrode 32a and the source/drain diffused layer 34, 35 constitute the load transistor L1.

In the device region 26b on both sides of the gate interconnection 32a, the source/drain diffused layer 36, 37 is formed. The gate electrode 32a and the source/drain diffused layer 36, 37 constitute the driver transistor D1.

The gate interconnection 32b is formed, crossing the device regions 26c, 26d. The gate interconnection 32b includes the gate electrode of the load transistor L2 and the gate electrode of the driver transistor D2, and commonly interconnects the gate electrode of the load transistor L2 and the gate electrode of the driver transistor D2. The gate interconnection 32b is extended up to a vicinity of the source/drain diffused layer 35 of the load transistor L1 formed in the device region 26a.

The source/drain diffused layer 38, 39 is formed in the device region 26c on both sides of the gate interconnection 32b. The gate electrode 32b and the source/drain diffused layer 38, 39 constitute the load transistor L2.

In the device region 26d on both sides of the gate interconnection 32b, the source/drain diffused layer 40, 41 is formed. The gate electrode 32b and the source/drain diffused layer 40, 41 constitute the driver transistor D2.

The gate interconnection 32c is formed, crossing the device region 26b. The gate interconnection 32c includes the gate electrode of a transfer transistor T1 and commonly connects the gate electrodes of the transfer transistors T1 formed in the memory cells adjacent to each other.

In the device region 26b on both sides of the gate interconnection 32c, the source/drain diffused layer 37, 42 is formed. The gate electrode 32c and the source/drain diffused layer 37, 42 constitute the transfer transistor T1. The source/drain diffused layer 37 of the transfer transistor T1 and the source/drain diffused layer 37 of the driver transistor D1 are formed commonly of the source/drain diffused layer 37.

The gate interconnection 32d is formed, crossing the device region 26d. The gate interconnection 32d includes the gate electrode of the transfer transistor T2 and commonly interconnects the gate electrodes of the transfer transistors T2 formed in adjacent memory cells.

The source/drain diffused layer 40, 41 is formed in the device region 26d on both sides of the gate electrode 32d. The gate electrode 32d and the source/drain diffused layer 40, 43 constitute the transfer transistor T2. The source/drain diffused layer 40 of the transfer transistor T2 and the source/drain diffused layer 40 of the driver transistor D2 are formed of the common source/drain diffused layer 40.

A silicide film 44a, 44b of, e.g., cobalt silicide ($CoSi_2$) is formed on the gate interconnections 32a–32d and the source/drain diffused layer 34–43. The silicide film 44b formed on the source/drain diffused layer 34–43 form the source/drain electrodes.

As illustrated in FIG. 2, the load transistor L1 and the load transistor L2 are arranged symmetrical with respect to a point. The driver transistor D1 and the driver transistor D2 are arranged symmetrical with respect to a point. The transfer transistor T1 and the transfer transistor T2 are arranged symmetrical with respect to a point. The memory cells in such layout are called symmetry cells.

An inter-layer insulation film 46 is formed on the semiconductor substrate 10 with the transistors L1, L2, D1, D2, T1, T2.

In the inter-layer insulation film 46, contact holes 48a, 48b are formed down to the source/drain diffused layer 34–43 or the gate electrodes 32a–32d.

A contact hole 48b for integrally exposing the gate interconnection 32a and the source/drain diffused layer 38 is formed at the intersection between the gate interconnection 32a and the device region 26c.

A contact hole 48c for integrally exposing the gate interconnection 32b and the source/drain diffused layer 35 is formed in the intersection between the gate interconnection 32b and the device region 26a.

A barrier film 47 is formed on the inside walls of the contact hole 48a–48c. In the contact holes 48a–48c with the barrier film 47 formed on the inside walls, a tungsten film 49 is buried. The barrier film 47 and the tungsten film 49 constitute conductor plugs 50a–50c.

As illustrated in FIG. 5, the conductor plug 50b is in contact with the gate interconnection 32a and the source/drain diffused layer 38. That is, the gate interconnection 32a and the source/drain diffused layer 38 are connected to each other by the conductor plug 50b alone without using an interconnection. The gate interconnection 32a and the source/drain diffused layer 38 are connected to each other by the conductor plug 50b alone, which contributes to reducing the memory cell region.

The conductor plug 50c is in contact with the gate interconnection 32b and the source/drain diffused layer 35. That is, the gate interconnection 32b and the source/drain diffused layer 35 are connected to each other with the conductor plug 50c alone. The gate interconnection 32b and the source/drain diffused layer 35 are connected to each other by the conductor plug 50c alone, which contributes to reducing the memory cell region.

A plurality of interconnections 52 are formed on the inter-layer insulation film 46.

As illustrated in FIG. 9, the source/drain diffused layer 34 of the load transistor L1 and the source/drain diffused layer 39 of the load transistor L2 are electrically connected to a source voltage Vdd via the conductor plug 50a and the interconnection 52.

The source/drain diffused layer 36 of the driver transistor D1 and the source/drain diffused layer 41 of the driver transistor D2 are electrically connected to an earth voltage Vss via the conductor plug 50a and the interconnection 52.

The gate interconnection 32c and the gate interconnection 32d are electrically connected to a word line WL via the conductor plug 50a and the interconnection 52.

The source/drain diffused layer 42 of the transfer transistor T1 and the source/drain diffused layer 43 of the transfer transistor T2 are electrically connected to a bit line BL via the conductor plug 50a and the interconnection 52.

The load transistor L1 and the driver transistor D1 constitute an inverter 54a. The load transistor L2 and the driver transistor D2 constitute an inverter 54b. The inverter 54a and the inverter 54b constitute a flip-flop circuit 56. The flip-flop circuit 56 is controlled by the transfer transistors T1, T2 connected to the bit line BL and the word line WL. The load transistors L1, L2, the driver transistors D1, D2 and the transfer transistors T1, T2 constitute the memory cell (SRAM cell) 58.

As illustrated in FIG. 6, a peripheral circuit region 31 is arranged adjacent to the memory cell region 29 where a plurality of memory cells 58 are formed.

In the peripheral circuit region 31, an n-type well (not illustrated) and a p-type well (not illustrated) are formed.

Device isolation region 28 for defining device regions 26e, 26f are formed on the semiconductor substrate 10 with the p-type wells and the n-type well formed on.

The gate interconnection 32a is extended into the device regions 26e, 26f of the peripheral circuit region 31. The gate interconnection 32a extended into the device regions 26e, 26f of the peripheral circuit region 31 constitutes the gate electrodes of the peripheral circuit transistors. In other words, the gate electrode of the load transistor L1, the gate electrode of the driver transistor D1 and the gate electrode of the peripheral transistor are connected to each other by the common gate interconnection 32a.

The gap $d_2$ between the gate interconnections 32a extended into the peripheral circuit region 31, and the gate interconnection 32d is substantially equal to the gap $d_1$ between the gate interconnection 32b and the gate interconnection 32c, or larger than the latter. In the design data or the reticle, the gap $d_2$ between the gate interconnection 32a extended into the peripheral circuit region 31, and the gate interconnection 32d is set larger than the gap $d_1$ between the gate interconnection 32b and the gate interconnection 32c.

The gap $d_2$ between the gate interconnection 32a extended into the peripheral circuit region 31 and the gate interconnection 32d, and the gap $d_1$ between the gate interconnection 32b and the gate interconnection 32c are set as described above for the following reason.

In the memory cell 58 where the gate interconnections 32 are arranged, for higher integration, at a smaller gap than that of the general design standards it is important to set the gap between the gate interconnections 32 in consideration of the set-back of the patterns caused in exposing the patterns on a photoresist film. The set-back of the patterns caused in exposing the patterns on a photoresist film is due to diffracted light.

The gate interconnection 32b and the gate interconnection 32c are arranged with the ends thereof positioned adjacent to each other. The ends of the pattern for forming the gate interconnection 32b and the pattern for forming the gate interconnection 32c are set back to some extent, and the end of the gate interconnection 32b and the end of the gate interconnection 32c are tapered forward. In order to connect the conductor plug 50c and the gate interconnection 32b with a sufficient contact area while ensuring a sufficient disalignment margin, it is necessary that the length of the part of the gate interconnection 32b, which is present in the device isolation region 28 is set relatively large. In order to form the transfer transistor T1 of good electric characteristics, it is necessary that the length of the part of the gate interconnection 32c, which is present in the device isolation region 28 is set relatively large. Accordingly, it is preferable that the patterns for forming the gate interconnection 32b and the pattern for forming the gate interconnection 32c is set relatively small. Even when the gap $d_1$ between the pattern for forming the gate interconnection 32b and the pattern for forming the gate interconnection 32c is set relatively small in the design data or on the retcile, the gate interconnection 32b and the gate interconnection 32c are never short-circuited, because the ends of both the pattern for forming the gate interconnection 32b and the pattern for forming the gate interconnection 32c are set back to some extent.

On the other hand, as for the gate interconnection 32a extended into the peripheral circuit region 31 and the gate interconnection 32d, the corner of the gate interconnection 32a and the end of the gate interconnection 32d are near each other. The pattern for forming the gate interconnection 32d is set back to some extent in the exposure, but the corner of the gate interconnection 32a is not substantially set back. When the pattern for forming the gate interconnection 32a and the pattern for forming the gate interconnection 32d are set at a relatively small gap, there is a risk that the gate interconnection 32a and the gate interconnection 32d may be short-circuited. Then, in the present embodiment, the gap $d_2$ between the gate interconnection 32a extended into the peripheral circuit region 31 and the gate interconnection 32d is set relatively large in the design data and on the reticle. Even when the gap $d_2$ between the gate interconnection 32a and the gate interconnection 32d is set relatively large in the design data and on the reticle, the gate interconnection 32a and the conductor plug 50b are connected with a sufficient contact area because the corner of the gate interconnection 32a is not substantially set back.

For the above-described reason, in the design data and on the reticle, the gap $d_2$ between the gate interconnection 32a extended into the peripheral circuit region 31 and the gate interconnection 32d is set larger than the gap $d_1$ between the gate interconnection 32b and the gate interconnection 32c. Since the gap $d_2$ between the gate interconnection 32a extended into the peripheral circuit region 31 and the gate interconnection 32d is set larger than the gap $d_1$ between the gate interconnection 32b and the gate interconnection 32c in the design data and on the reticle, whereby the gap $d_2$ between the gate interconnection 32a extended into the peripheral circuit region 31 and the gate interconnection 32d is substantially equal to or larger than the gap $d_1$ between the gate interconnection 32b and the gate interconnection 32c in the actually fabricated semiconductor device.

A source/drain diffused layer 54, 55 is formed in the device regions 26e, 26f on both sides of the gate electrode 32a extended into the peripheral circuit region 31. The gate electrode 32a and the source/drain diffused layer 54, 55 constitute transistors S1, S2 for the peripheral circuit.

An inter-layer insulation film 46 is formed on the semiconductor substrate 10 with the transistors S1, S2 for the peripheral circuit.

In the inter-layer insulation film 46, contact holes 48c are formed down to the source/drain diffused layer 54, 55.

Conductor plugs 50d are buried in the contact holes 48c.

On the inter-layer insulation film 46 with the conductor plugs 50d buried in, interconnections 52a are formed, connected to the conductor plugs 50d.

Thus, the logic circuit block of the semiconductor device according to the present embodiment is constituted.

The memory cells (SRAM cells) in the switch matrix 18 have the same structure as the memory cells 58 described above with reference to FIGS. 2 to 9.

Thus, the semiconductor device according to the present embodiment is constituted.

The semiconductor device according to the present embodiment is characterized mainly in that the memory cells 58 in the logic blocks and the switch matrices are SRAM cells each including six transistors; the gate interconnection 32a including the gate electrode of the load transistor L1 and the gate electrode of the driver transistor D1 is formed linearly, arriving at a vicinity of the source/drain diffused layer 38 of the load transistor L2; the gate interconnection 32b including the gate electrode of the load transistor L2 and the gate electrode of the driver transistor D2 is formed linearly, arriving at a vicinity of the source/drain diffused layer 35 of the load transistor L1; the gate electrode 32c including the gate electrode of the transfer transistor T1 is positioned on an extension of the gate interconnection 32b; the gate interconnection 32d including the gate electrode of the transfer transistor T2 is positioned on an extension of the gate interconnection 32a; the gate interconnection 32a and the source/drain diffused layer 38 of the load transistor L2 are connected to each other by the conductor plug 50b alone; the gate interconnection 32b and the source/drain diffused layer 35 of the load transistor L1 are connected to each other by the conductor plug 50c alone; the source/drain diffused layer 37 of the transfer transistor T1 and the source/drain diffused layer 37 of the driver transistor D1 is formed of the common source/drain diffused layer 37; and the source/drain diffused layer 40 of the transfer transistor T2 and the source/drain diffused layer 40 of the driver transistor D2 are formed of the common source/drain diffused layer 40.

According to the present embodiment, the SRAM cell 58 has such layout, whereby the area for the SRAM cell 58 to be formed in can be very small. According to the present embodiment, SRAM cells 58 of such layout are used as the memory cells of the logic blocks and the memory cells of the switch matrices, which allows the area for the logic blocks and the switch matrices to be formed in to be small. Thus, the present embodiment can contribute to down-sizing, high integration and large capacity, etc. of semiconductor devices.

Figure 20:
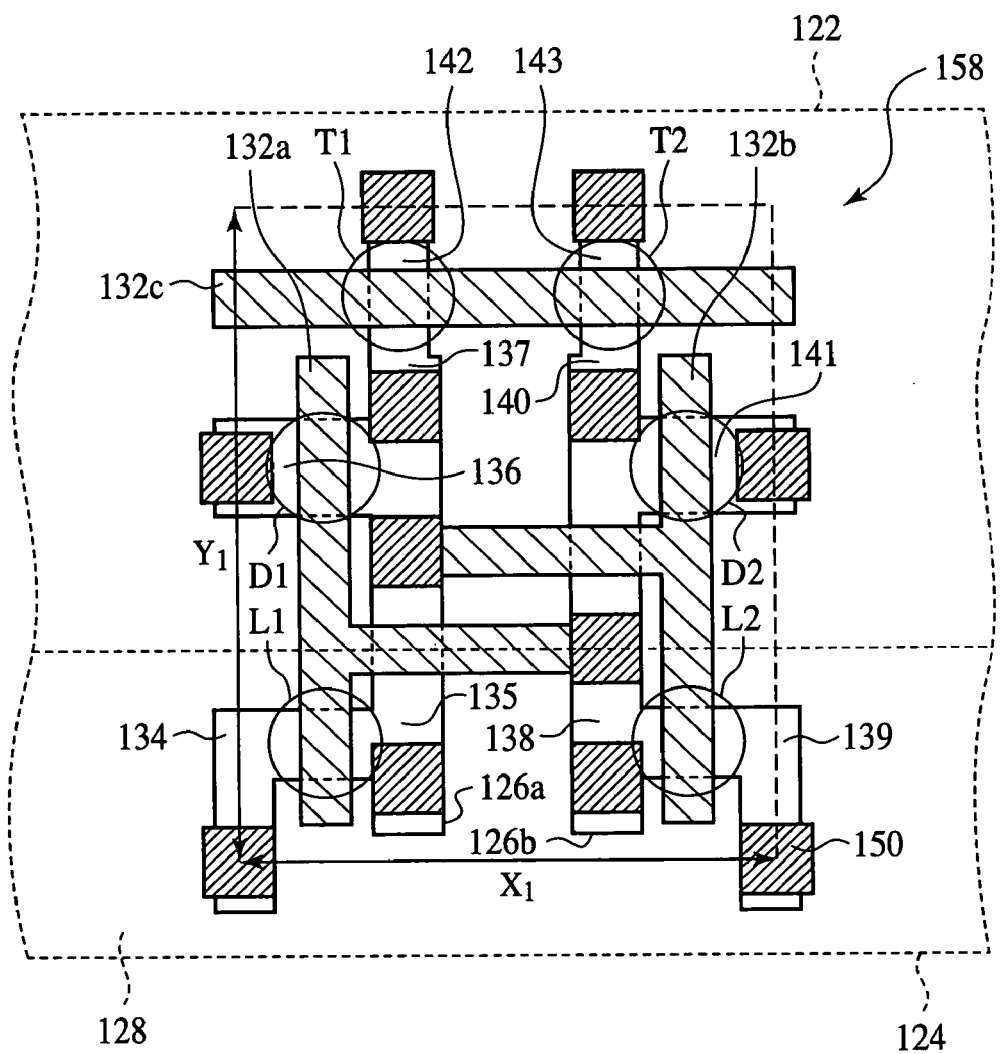
FIG. 20 is a plan view of the SRAM cell of the proposed semiconductor device.

As illustrated in FIG. 2, the left-to-right (as viewed in the drawing) length $X_2$ of the SRAM cell 58 is set at, e.g., about 1.47 µm. As described above, the left-to-right (as viewed in the drawing) length $X_1$ of the SRAM cell 158 of FIG. 20 is about 1.47 µm. Thus, the left-to-right length of the SRAM cell 58 of the semiconductor device according to the present embodiment is substantially equal to the left-to-right (as viewed in the drawing) length $X_1$ of the SRAM cell 158 illustrated in FIG. 20.

On the other hand, the up-to-down (as viewed in the drawing) length $Y_2$ Of the SRAM cell 58 is about 0.665 μm. As described above, the up-to-down (as viewed in the drawing) length $Y_2$ Of the SRAM cell 158 illustrated in FIG. 20 is about 0.665 μm. Thus, the up-to-down (as viewed in the drawing) length $Y_2$ of the SRAM cell 58 of the semiconductor device according to the present embodiment is as small as about 0.4 times the up-to-down (as viewed in the drawing) length $Y_2$ Of the SRAM cell illustrated in FIG. 20.

FIG. 10 is plan views of the proposed semiconductor device and the semiconductor device according to the present embodiment, which are presented for comparison. The plan view of the proposed semiconductor device is shown on the left side of the drawing of FIG. 10, and on the right side of the drawing of FIG. 10, the semiconductor device according to the present embodiment is shown.

As illustrated in FIG. 10, in the logic block of the proposed semiconductor device, the memory cell region 129 and the peripheral circuit region 131 are alternately provided. In the logic block 12 of the semiconductor device according to the present embodiment, the memory cell region 29 and the peripheral circuit region 31 are alternately provided.

The up-to-down (as viewed in the drawing) length $d_2$ of the memory cell region 29 of the semiconductor device according to the present embodiment is about 0.4 times the up-to-down (as viewed in the drawing) length $d_1$ of the memory cell region 129 of the proposed semiconductor device.

The up-to-down (as viewed in the drawing) length $d_4$ of the logic block 12 of the semiconductor device according to the present embodiment is about 0.82 times the up-to-down (as viewed in the drawing) length $d_3$ of the logic block of the proposed semiconductor device. That is, the semiconductor device according to the present embodiment can reduce the area of the logic block 12 by about 18% in comparison with the proposed semiconductor device.

That of the area of the semiconductor chip 10, which is occupied by the logic blocks 12 is about 40%, and the area of the semiconductor chip 10 can be reduced by about 7% as a whole.

In the present embodiment, the memory cell 58 is formed column-wise in two rows in the memory cell region 29, but when the memory cell is formed only in one row in the memory cell region, the up-to-down (as viewed in the drawing) length of the n-type well 24 is too short to satisfy the design rules. Accordingly, when the memory cells are formed only in one row in the memory cell region, it is preferable to partially use the memory cell 158 of the proposed semiconductor device. The memory cell 158 of the proposed semiconductor device illustrated in FIG. 20, in which the n-type well 124 is formed in the left-to-right direction as viewed in FIG. 20, can satisfy the design rules.

Figure 11:
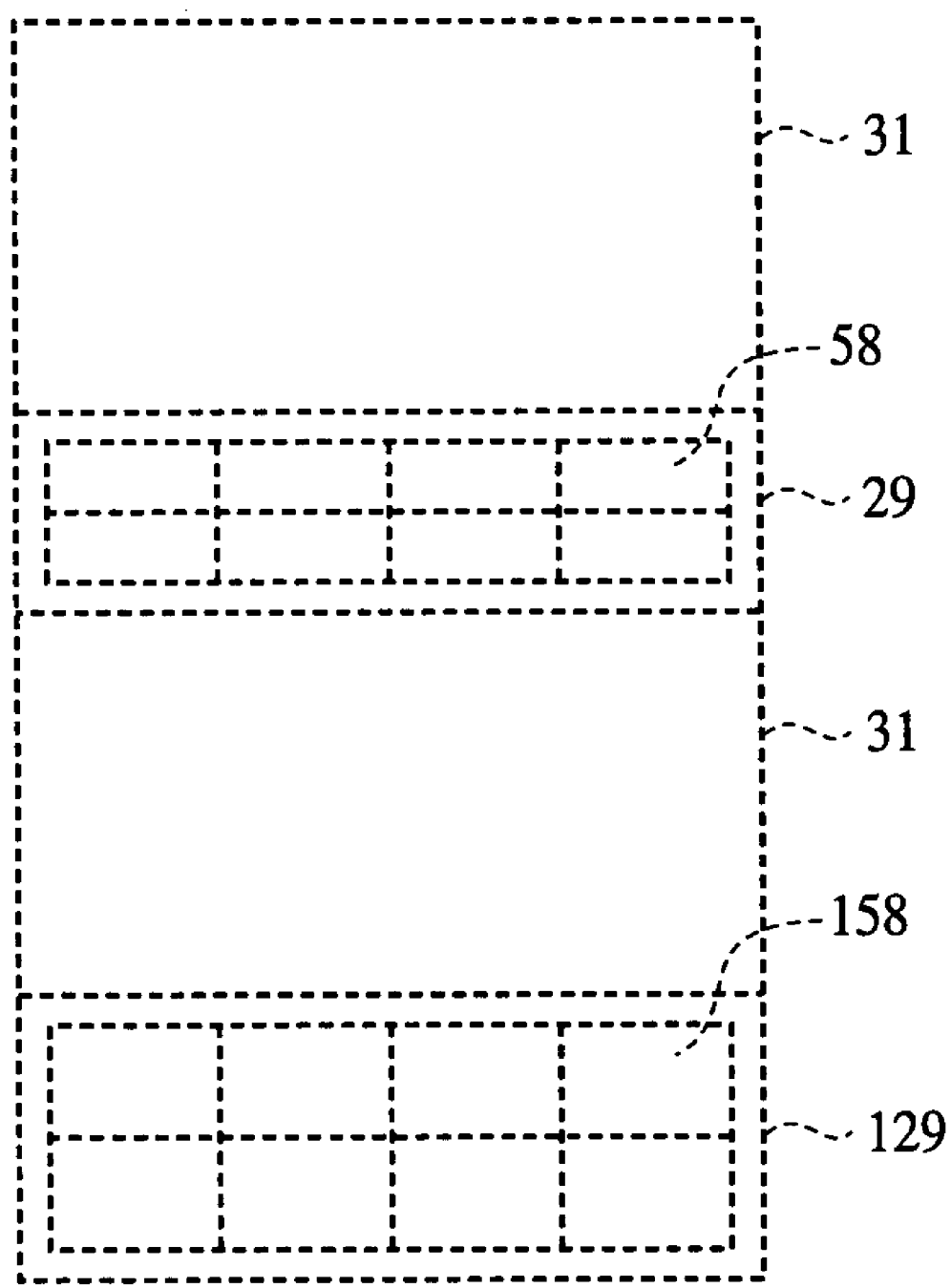
FIG. 11 is a conceptual view of the semiconductor device according to one modification of the embodiment of the present invention.
Figure 12:
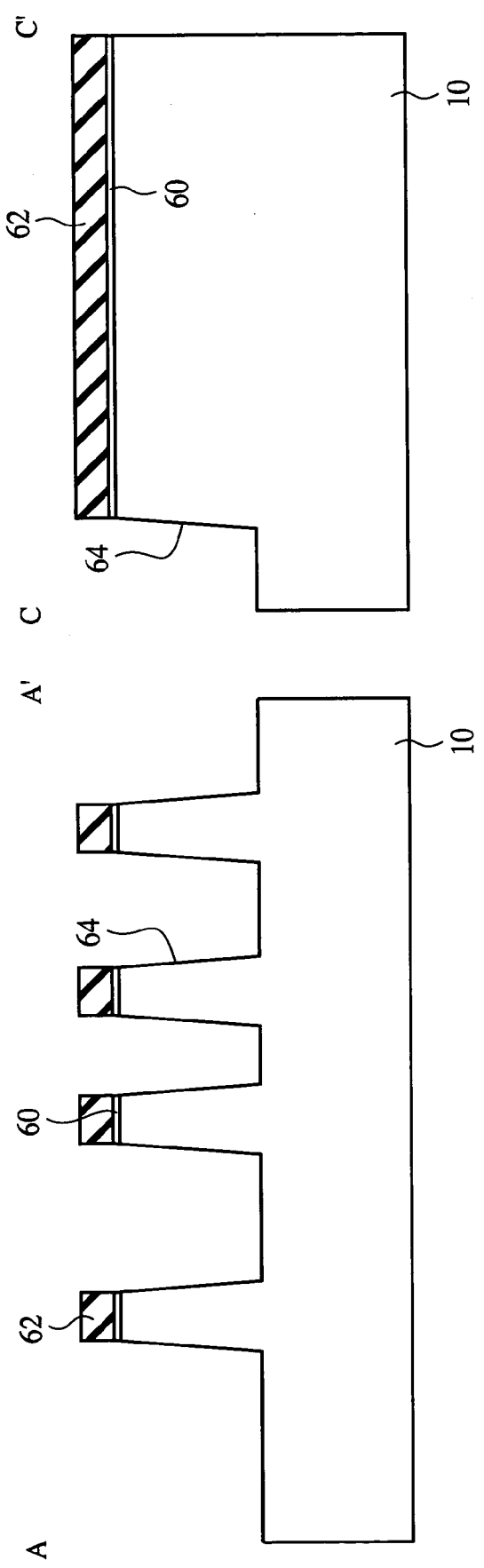
FIG. 12 is a sectional view of the semiconductor device according to the embodiment of the present invention in the steps of the method for fabricating the semiconductor device, which illustrates the method (Part 1).

FIG. 11 is a conceptual view of the semiconductor device according to one modification of the present embodiment.

As illustrated in FIG. 11, in the logic block 12, memory cell regions 29, 134 and a peripheral circuit region 31 are arranged. In the memory cell region 29, the memory cell 58 is formed in two rows in the up-to-down direction as viewed in the drawing. In the memory cell region 129, the memory cell 158 is formed only in one row.

Thus, the memory cells 158 of the proposed semiconductor device may be partially used.

(The Method for Fabricating the Semiconductor Device)

Then, the method for fabricating the semiconductor device according to the present embodiment will be explained with reference to FIGS. 12 to 19. FIGS. 12 to 19 are sectional views of the semiconductor device according to the present embodiment in the steps of the method for fabricating the semiconductor device, which illustrate the method. The left sides of the drawings of FIGS. 12 to 19 are sectional views along the line A—A' in FIG. 2, and the right sides of the drawings of FIGS. 12 to 19 are sectional views along the line C—C' in FIG. 2.

First, the semiconductor substrate 10 of, e.g., p-type silicon is prepared.

Next, a 10 nm-thickness silicon oxide film 60 is formed on the entire surface of the semiconductor substrate 10 by, e.g., thermal oxidation.

Next, a 100 nm-thickness silicon nitride film 62 is formed on the entire surface by, e.g., CVD.

Next, the silicon nitride film 62 and the silicon oxide film 60 are patterned by photolithography.

Next, with the silicon nitride film 62 as the mask, the semiconductor substrate 10 is etched. Thus, trenches 64 are formed in the semiconductor substrate 10. The depth of the trenches 64 is about 300 nm from the surface of the semiconductor substrate 10.

Figure 13:
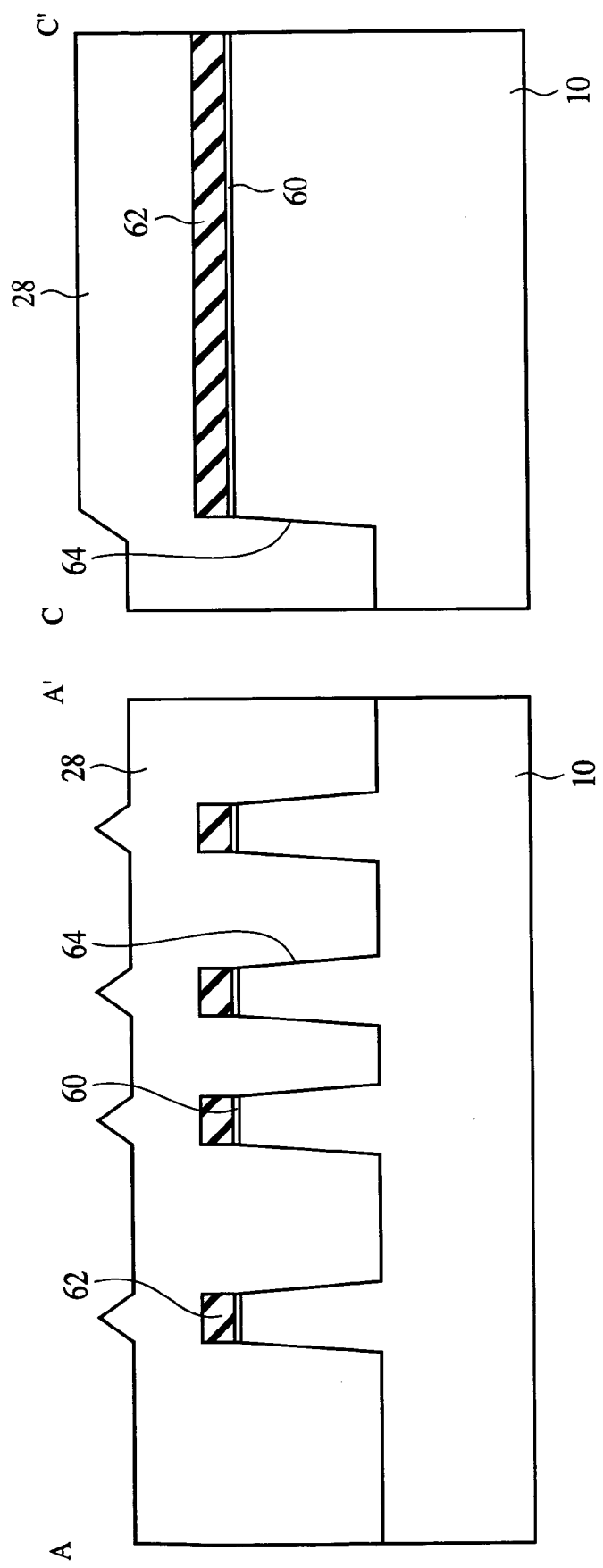
FIG. 13 is a sectional view of the semiconductor device according to the embodiment of the present invention in the steps of the method for fabricating the semiconductor device, which illustrates the method (Part 2).

Next, as illustrated in FIG. 13, a 500 nm-thickness silicon oxide film 28 is formed by, e.g., thermal CVD.

Figure 14:
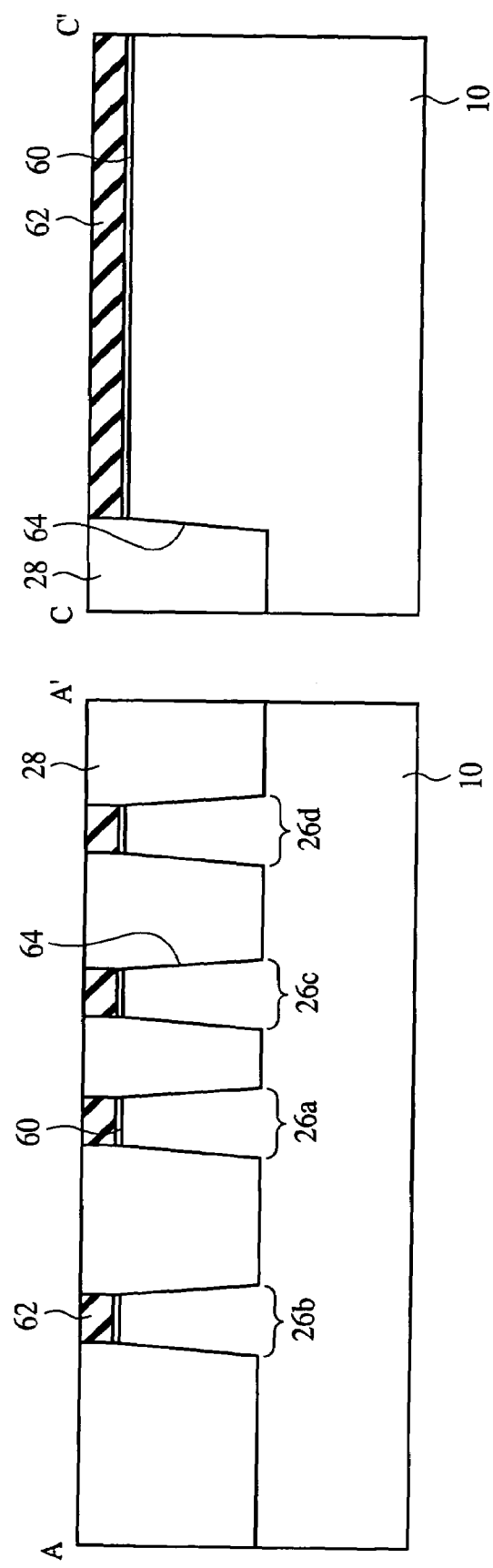
FIG. 14 is a sectional view of the semiconductor device according to the embodiment of the present invention in the steps of the method for fabricating the semiconductor device, which illustrates the method (Part 3).

Next, as illustrated in FIG. 14, the surface of the silicon nitride film 62 is polished by, e.g., CMP until the surface of the silicon oxide film 28 is exposed. At this time, the silicon nitride film 62 functions as the stopper film in the polish. Thus, the device isolation regions of the silicon oxide film 28 are buried in the trenches 64, and the device regions are defined by the device isolation regions 28.

Next, thermal processing is performed at, e.g., 1000° C. for 30 seconds. This thermal processing is for making the silicon oxide film buried in the trenches dense.

Figure 15:
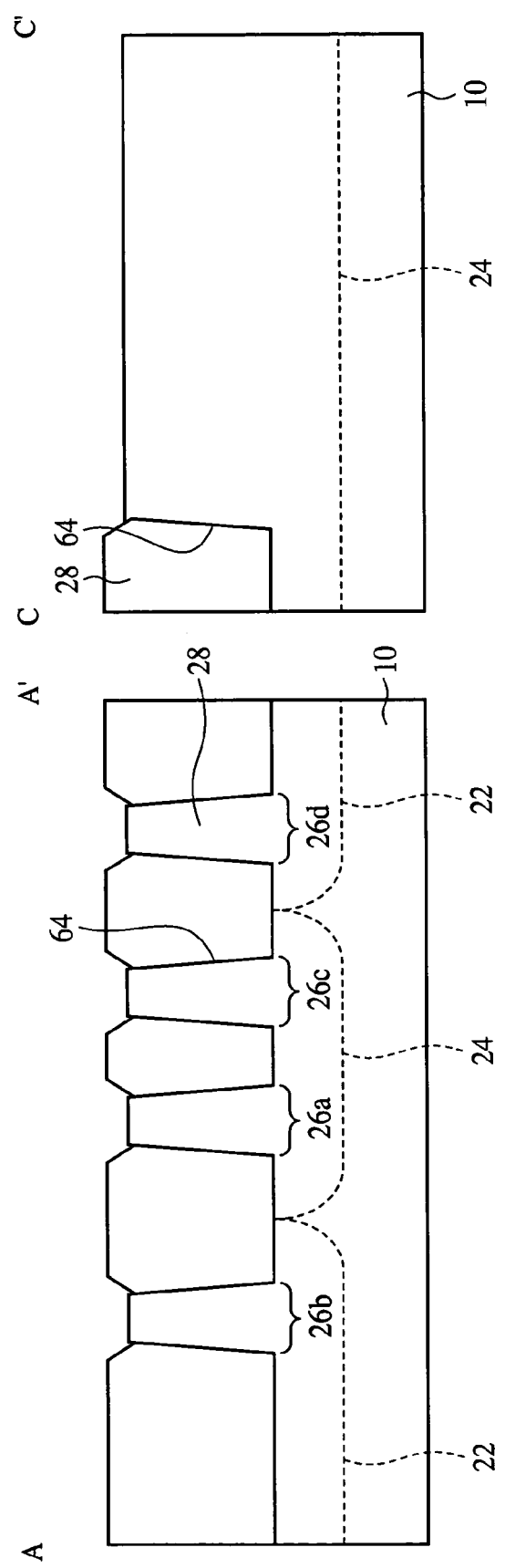
FIG. 15 is a sectional view of the semiconductor device according to the embodiment of the present invention in the steps of the method for fabricating the semiconductor device, which illustrates the method (Part 4).

Then, as illustrated in FIG. 15, the silicon nitride film 62 and the silicon oxide film 60 remaining in the device regions are removed by, e.g., wet etching. In etching off the silicon nitride film 62, phosphoric acid, for example, is used. In etching off the silicon oxide film 60, hydrofluoric acid for example, is used.

Next, a photoresist film (not illustrated) is formed on the entire surface by, e.g., spin coating.

Next, openings (not illustrated) for exposing the p-type wells 22 are formed in the photoresist film.

Next, a p-type dopant impurity is implanted by, e.g., ion implantation and with the photoresist film as the mask. Thus, the p-type wells 22 are formed. Then, the photoresist film is released.

Then, a photoresist film (not illustrated) is formed on the entire surface by, e.g., spin coating.

Next, an opening (not illustrated) for exposing the n-type well 24 is formed in the photoresist film.

Then, an n-type dopant impurity is implanted by, e.g., ion implantation and with the photoresist film as the mask. Thus, the n-type well 24 is formed. Then, the photoresist film is released.

Next, a photoresist film is formed on the entire surface by, e.g., spin coating.

Then, openings for exposing the device regions are formed in the photoresist film.

Next, with the photoresist film as the mask, a p-type dopant impurity is implanted. Thus, a channel doped layer (not illustrated) is formed in the device regions 26*b*, 26*d*. The channel doped layer is for controlling the threshold voltage. Then, the photoresist film is released.

Next, a photoresist film is formed on the entire surface by, e.g., spin coating.

Then, openings for exposing the device regions are formed in the photoresist film.

Then, with the photoresist film as the mask, an n-type dopant impurity is implanted. Thus, a channel doped layer (not illustrated) is formed in the device regions 26a, 26b. Then, the photoresist film is released.

Figure 16:
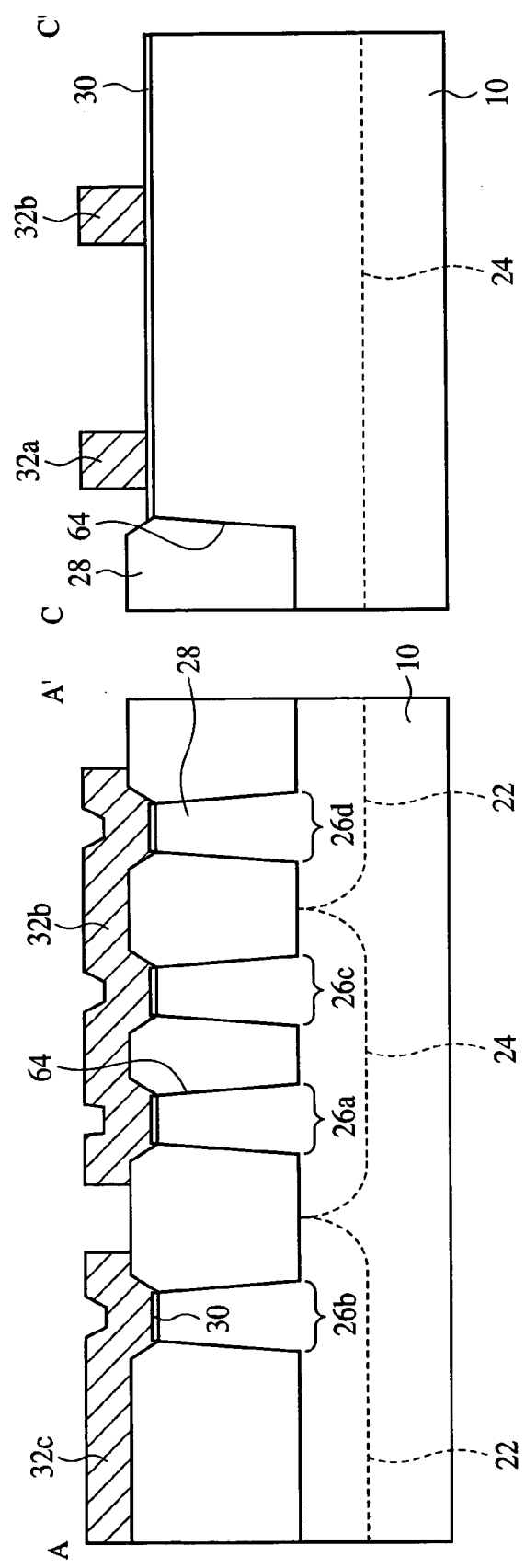
FIG. 16 is a sectional view of the semiconductor device according to the embodiment of the present invention in the steps of the method for fabricating the semiconductor device, which illustrates the method (Part 5).
Figure 17:
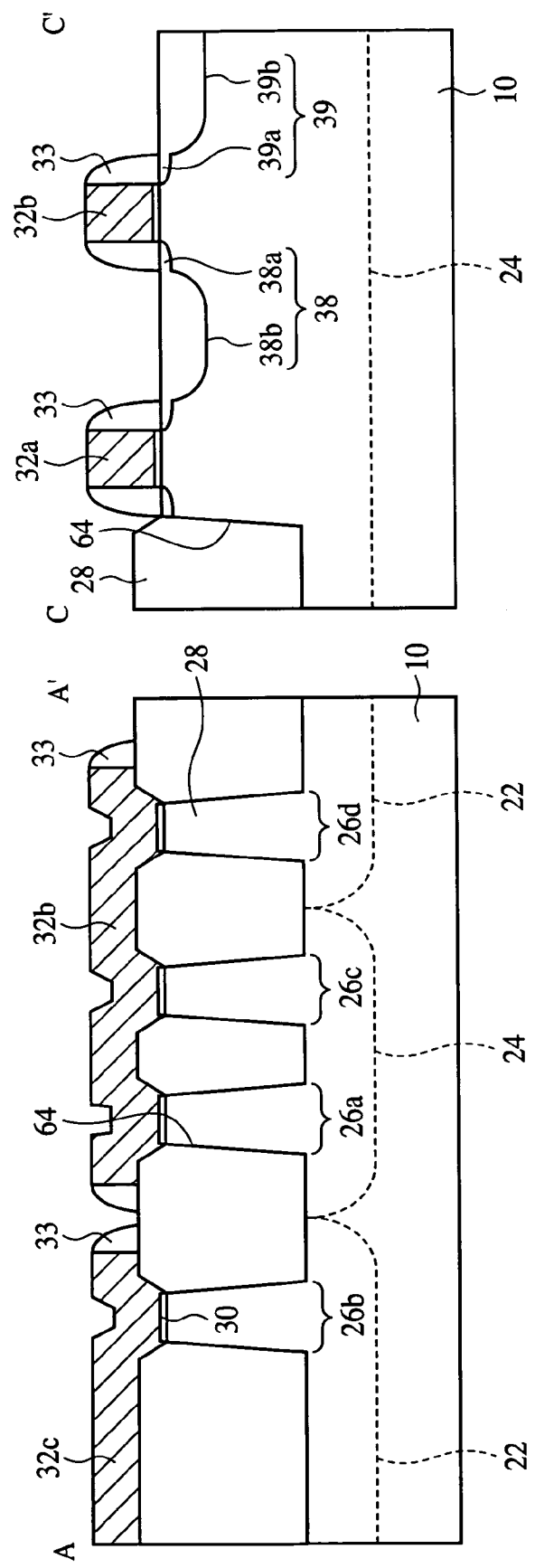
FIG. 17 is a sectional view of the semiconductor device according to the embodiment of the present invention in the steps of the method for fabricating the semiconductor device, which illustrates the method (Part 6).
Figure 18:
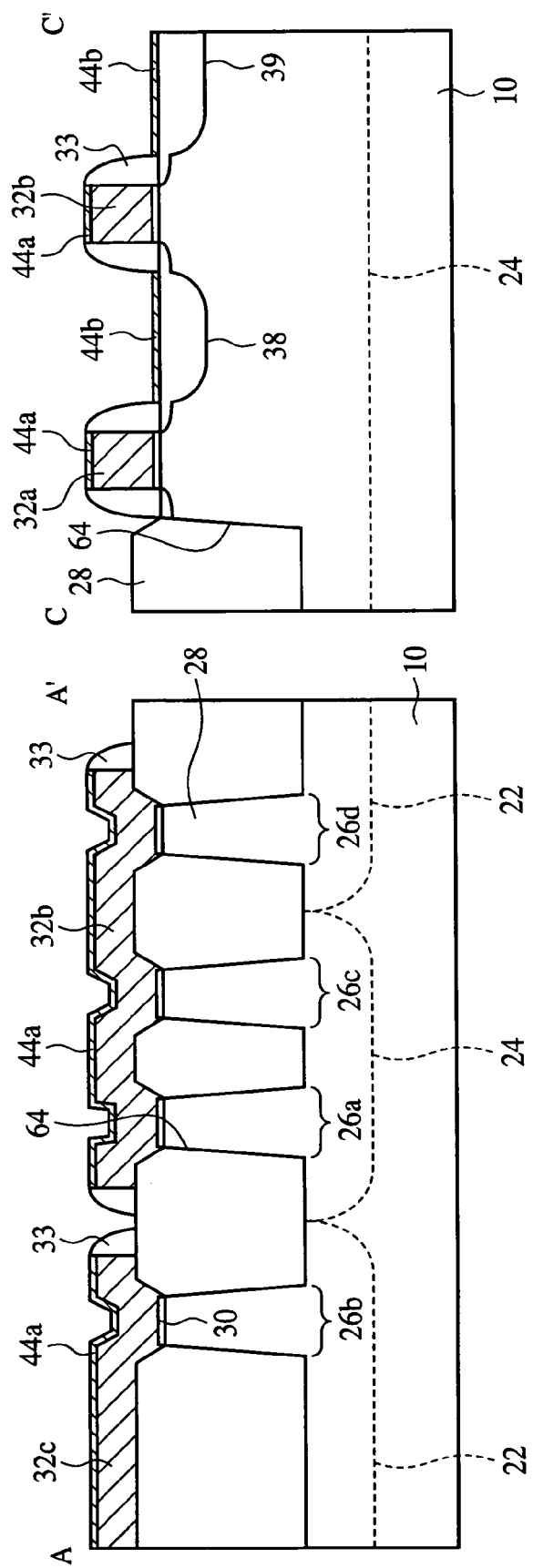
FIG. 18 is a sectional view of the semiconductor device according to the embodiment of the present invention in the steps of the method for fabricating the semiconductor device, which illustrates the method (Part 7).

Then, as illustrated in FIG. 16, a 2 nm-thickness gate insulation film 30 is formed by, e.g., thermal oxidation.

Next, a 150 nm-thickness polysilicon film 32 is formed by, e.g., CVD. The polysilicon film 32 is for forming the gate interconnections 32a–32d and the dummy patterns 32e, 32f.

Then, the polysilicion film 32 is patterned by photolithography. Thus, the gate interconnections 32a–32d and the dummy patterns 32e, 32f are formed.

Then, a photoresist film (not illustrated) is formed on the entire surface by, e.g., spin coating.

Then, openings for exposing the device regions 26b, 26d are formed in the photoresist film.

Then, an n-type dopant impurity is implanted by, e.g., ion implantation and with the photoresist film and the gate interconnections 32a–32d as the mask. The n-type dopant impurity is arsenic (As$^+$). Conditions for the ion implantation are, e.g., a 3 keV acceleration voltage and a $1\times10^{14}$ cm$^{-2}$ dose. Thus, an n-type lightly doped diffused layer (not illustrated) is formed. Then, the photoresist film is released.

Next, a photoresist film (not illustrated) is formed on the entire surface by, e.g., spin coating.

Next, openings for exposing the device regions 26a, 26c are formed in the photoresist film.

Then, an p-type dopant impurity is implanted by, e.g., ion implantation and with the photoresist film and the gate interconnections 32a, 32b as the mask. The p-type dopant impurity is boron (B$^+$). Conditions for the ion implantation are, e.g., a 0.5 keV acceleration voltage and a $1\times10^{15}$ cm$^{-2}$ dose. Thus, the p-type lightly doped diffused layer 38a, 39a is formed. Then, the photoresist film is released.

Then, a 100 nm-thickness silicon oxide film 33 is formed on the entire surface by, e.g., CVD.

Next, the silicon oxide film 33 is anisotropically etched. Thus, the sidewall insulation film of the silicon oxide film 33 is formed on the side walls of the gate interconnections.

Next, a photoresist film (not illustrated) is formed on the entire surface by, e.g., spin coating.

Then, openings for exposing the device regions 26b, 26d are formed in the photoresist film.

Next, an n-type dopant impurity is implanted by, e.g., ion implantation and with the photoresist film and the gate interconnections 32a–32d as the mask. The n-type dopant impurity is phosphorus (P$^+$). Conditions for the ion implantation are, e.g., a 10 keV acceleration voltage and a $2\times20^{15}$ cm$^{-2}$ dose. Thus, an n-type heavily doped diffused layer (not illustrated) is formed. The n-type lightly doped diffused layer and the heavily doped diffused layer constitute the n-type source/drain diffused layers 36, 37, 40–43 of the LDD structure. Then, the photoresist film is released.

Next, a photoresist film (not illustrated) is formed on the entire surface by, e.g., spin coating.

Then, openings for exposing the device regions 26a, 26c are formed in the photoresist film.

Then, a p-type dopant impurity is implanted by, e.g., ion implantation and with the photoresist film and the gate interconnections 32a, 32b as the mask. The p-type dopant impurity is boron (B$^+$). Conditions for the ion implantation are, e.g., a 5 keV acceleration voltage and a $2\times10^{15}$ cm$^{-2}$ dose. Thus, the p-type heavily doped diffused layer 38b, 39b is formed. The p-type lightly doped diffused layer and the p-type heavily doped diffused layer constitute the p-type source/drain diffused layer 34, 35, 38, 39 of the LDD structure. Then, the photoresist film is released (see FIG. 17).

Next, thermal processing is performed at, e.g., 1000° C. for 3 seconds. This thermal processing is for activating the dopant impurities implanted in the source/drain diffused layer 34–43.

Next, a 10 nm-thickness cobalt film is formed on the entire surface by, e.g., sputtering.

Then, thermal processing is performed to react the Co and the Si with each other. Thus, the silicide film 44b of cobalt silicide is formed on the exposed surface of the source/drain diffused layer 34–43. The silicide film 44a of the cobalt silicide is formed on the exposed surfaces of the gate interconnections 32a–32d (see FIG. 18). Then, that of the cobalt film, which has not reacted is removed.

Figure 19:
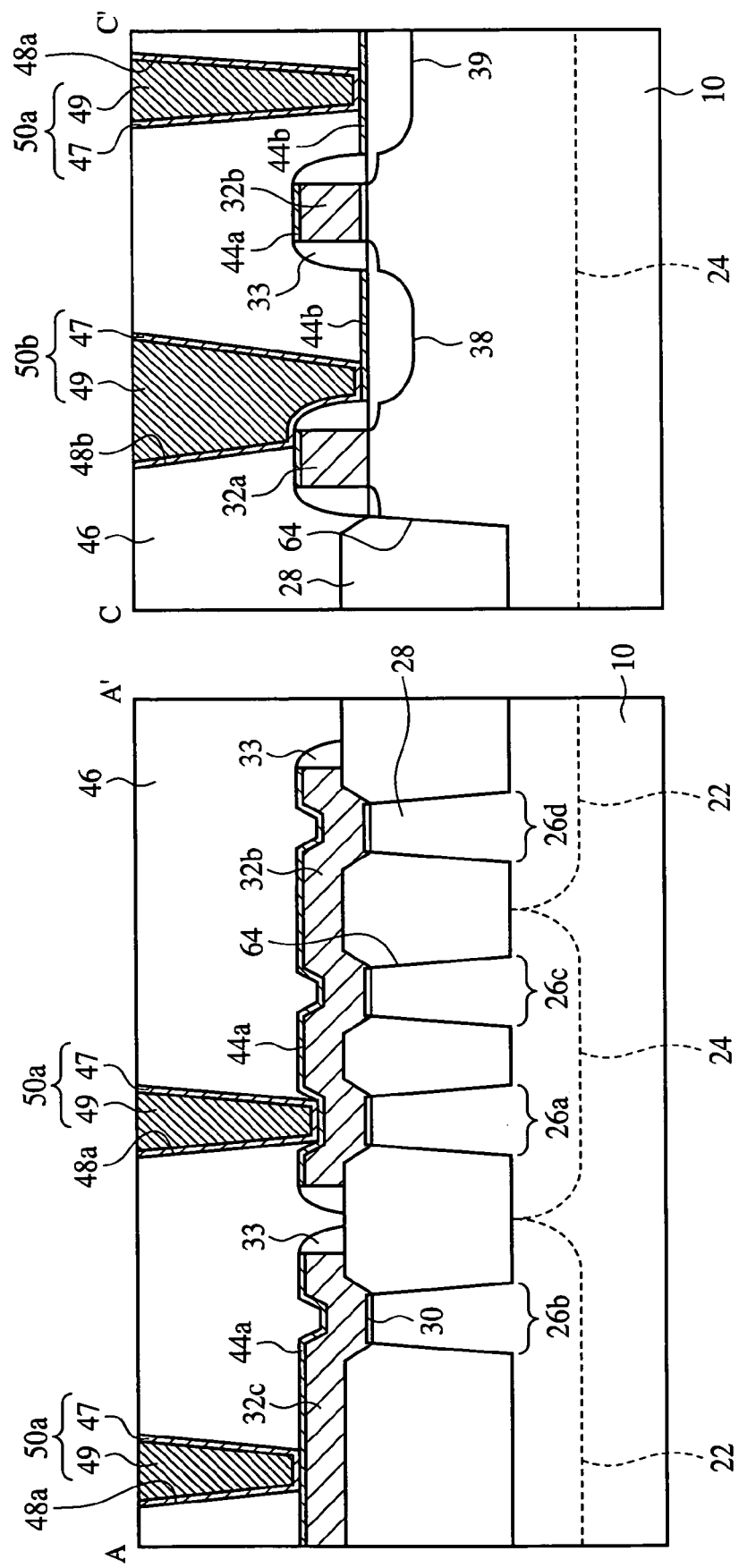
FIG. 19 is a sectional view of the semiconductor device according to the embodiment of the present invention in the steps of the method for fabricating the semiconductor device, which illustrates the method (Part 8).

Next, as illustrated in FIG. 19, the inter-layer insulation film 46 of a 700 nm-thickness silicon oxide film is formed on the entire surface by, e.g., CVD.

Then, the surface of the inter-layer insulation film 46 is polished by, e.g., CMP. Thus, the surface of the inter-layer insulation film 46 is planarized.

Next, a photoresist film (not illustrated) is formed on the entire surface by, e.g., spin coating.

Next, openings (not illustrated) are formed in the photoresist film by photolithography. The openings are for forming the contact holes 48a–48d.

Next, with the photoresist film as the mask, the inter-layer insulation film 46 is etched. Thus, the contact holes 48a–48d are formed in the inter-layer insulation film 46.

Then, a 10 nm-thickness T1 film and a 20 nm-thickness TiN film are sequentially formed by, e.g., sputtering. Thus, the barrier film 47 is formed of the T1 film and the TiN film.

Next, a 300 nm-thickness tungsten film 49 is formed by, e.g., CVD.

Next, the tungsten film 49 and the barrier film 47 are polished by, e.g., CMP until the surface of the inter-layer insulation film 46 is exposed. Thus, the conductor plugs 50a–50d are buried in the contact holes 48a–48d.

Then, the interconnections 52 (see FIG. 2) are formed on the inter-layer insulation film 46.

Thus, the semiconductor device according to the present embodiment is fabricated.

Modified Embodiments

The present invention is not limited to the above-described embodiment.

For example, the above-described embodiment has been explained by means of FPGA. However, the principle of the present invention is not limited to FPGA and is applicable to any other semiconductor device.

In the above-described embodiment, the memory cell is formed in two rows in a memory cell region but may be formed in three or more rows in a memory cell region.

What is claimed is:

1. A semiconductor device comprising a plurality of memory cells each of which comprises a first inverter including a first load transistor and a first driver transistor, a second inverter including a second load transistor and a second driver transistor, a first transfer transistor for controlling the first inverter and the second inverter, and a second transfer transistor for controlling the first inverter and the second inverter; a logic block forming a logical circuit, based data set in said plurality of memory cells; and an interconnection region connected to the logic block, the semiconductor device comprising:
   a first gate interconnection including the gate electrode of the first load transistor and the gate electrode of the first driver transistor, the first gate interconnection being formed linearly and reached to a vicinity of the source/drain diffused layer of the second load transistor;

a second gate interconnection including the gate electrode of the second load transistor and the gate electrode of the second driver transistor, the second gate interconnection being formed linearly and reached to a vicinity of the source/drain diffused layer of the first load transistor;

a third gate interconnection including the gate electrode of the first transfer transistor, the third gate interconnection being positioned on an extension of the second gate interconnection;

a fourth gate interconnection including the gate electrode of the second transfer transistor, the fourth gate interconnection being positioned on an extension of the first gate interconnection;

a first conductor plug contacting the first gate interconnection and the source/drain diffused layer of the second load transistor; and a second conductor plug contacting the second gate interconnection and the source/drain diffused layer of the first load transistor, one of the source/drain diffuse layer of the first transfer transistor, and one of the source/drain diffused layer of the first driver transistor being formed of the common source/drain diffused layer.

2. A semiconductor device according to claim 1, wherein one of the source/drain diffused layer of the second transfer transistor, and one of the source/drain diffused layer of the second driver transistor being formed of the common source/drain diffused layer.

3. A semiconductor device according to claim 1, further comprising
a peripheral circuit region where the transistors for a peripheral circuit are formed, the peripheral circuit region being adjacent to the memory cell region where the memory cells are formed,
the first gate interconnection being extended into the peripheral circuit region, and
the gate electrodes of the peripheral circuit transistors, the gate electrode of the first load transistor and the gate electrode of the first driver transistor being formed of the first gate interconnection.

4. A semiconductor device according to claim 3, wherein a gap between the first gate interconnection extended into the peripheral circuit region and the fourth gate interconnection is larger than a gap between the second gate interconnection and the third gate interconnection in design data or on a reticle.

5. A semiconductor device according to claim 3, wherein a gap between the first gate interconnection extended into the peripheral circuit region and the fourth gate interconnection is equal to or larger than a gap between the second gates interconnection and the third gate interconnection.

6. A semiconductor device according to claim 4, wherein the gap between the first gate interconnection extended into the peripheral circuit region and the fourth gate interconnection is equal to or larger than the gap between the second gates interconnection and the third gate interconnection.

7. A semiconductor device according to claim 1, further comprising:
a first dummy pattern formed of the same conducting layer as the first gate interconnection or the second gate interconnection at a peripheral part of the memory cell region along the first gate interconnection or the second gate interconnection; and a second dummy pattern formed of the same conducting layer as the third gate interconnection or the fourth gate interconnection at the peripheral part of the memory cell region along the third gate interconnection or the fourth gate interconnection.

8. A semiconductor device according to claim 3, further comprising:
a first dummy pattern formed of the same conducting layer as the first gate interconnection or the second gate interconnection at a peripheral part of the memory cell region along the first gate interconnection or the second gate interconnection; and a second dummy pattern formed of the same conducting layer as the third gate interconnection or the fourth gate interconnection at the peripheral part of the memory cell region along the third gate interconnection or the fourth gate interconnection.

9. A semiconductor device according to claim 1, wherein the memory cells are arranged in a plurality of rows which are perpendicular to the longitudinal direction of the first gate interconnection.

10. A semiconductor device according to claim 3, wherein the memory cells are arranged in a plurality of rows which are perpendicular to the longitudinal direction of the first gate interconnection.

11. A semiconductor device according to claim 1, wherein the interconnection region includes a plurality of interconnections, and a switch matrix forming an interconnection path, based on data set in other memory cell.

12. A semiconductor device according to claim 3, wherein the interconnection region includes a plurality of interconnections, and a switch matrix forming an interconnection path, based on data set in other memory cell.

13. A semiconductor device according to claim 11, wherein
said other memory cells each comprises a third inverter including the third load transistor and the third driver transistor, a fourth inverter including the fourth load transistor and the fourth driver transistor, a third transfer transistor for controlling the third inverter and the fourth inverter, and a fourth transfer transistor for controlling the third inverter and the fourth inverter.

14. A semiconductor device according to claim 12, wherein
said other memory cells each comprises a third inverter including the third load transistor and the third driver transistor, a fourth inverter including the fourth load transistor and the fourth driver transistor, a third transfer transistor for controlling the third inverter and the fourth inverter, and a fourth transfer transistor for controlling the third inverter and the fourth inverter.

15. A semiconductor device according to claim 13, comprising:
a fifth gate interconnection including the gate electrode of the third load transistor and the gate electrode of the third driver transistor, the fifth gate interconnection being formed linearly and reached to a vicinity of the source/drain diffused layer of the fourth load transistor;

a sixth gate interconnection including the gate electrode of the fourth load transistor and the gate electrode of the fourth driver transistor, the sixth gate interconnection being formed linearly and reached to a vicinity of the source/drain diffused layer of the third load transistor;

a seventh gate interconnection including the gate electrode of the third transfer transistor, the seventh gate interconnection being positioned on an extension of the sixth gate interconnection;

an eighth gate interconnection including the gate electrode of the fourth transfer transistor, the eighth gate interconnection being positioned on an extension of the fifth gate interconnection;

a third conductor plug contacting the fifth gate interconnection and the source/drain diffused layer of the fourth load transistor; and a fourth conductor plug contacting the sixth interconnection and the source/drain diffused layer of the third load transistor, one of the source/drain diffused layer of the third transfer transistor, and one of the source/drain diffused layer of the third driver transistor being formed of the common source/drain diffused layer, and one of the source/drain diffused layer of the fourth transfer transistor, and one of the source/drain diffused layer of the fourth driver transistor being formed of the common source/drain diffused layer.

16. A semiconductor device according to claim 14, comprising:

a fifth gate interconnection including the gate electrode of the third load transistor and the gate electrode of the third driver transistor, the fifth gate interconnection being formed linearly and reached to a vicinity of the source/drain diffused layer of the fourth load transistor;

a sixth gate interconnection including the gate electrode of the fourth load transistor and the gate electrode of the fourth driver transistor, the sixth gate interconnection being formed linearly and reached to a vicinity of the source/drain diffused layer of the third load transistor;

a seventh gate interconnection including the gate electrode of the third transfer transistor, the seventh gate interconnection being positioned on an extension of the sixth gate interconnection;

an eighth gate interconnection including the gate electrode of the fourth transfer transistor, the eighth gate interconnection being positioned on an extension of the fifth gate interconnection;

a third conductor plug contacting the fifth gate interconnection and the source/drain diffused layer of the fourth load transistor; and a fourth conductor plug contacting the sixth interconnection and the source/drain diffused layer of the third load transistor, one of the source/drain diffused layer of the third transfer transistor, and one of the source/drain diffused layer of the third driver transistor being formed of the common source/drain diffused layer, and one of the source/drain diffused layer of the fourth transfer transistor, and one of the source/drain diffused layer of the fourth driver transistor being formed of the common source/drain diffused layer.

* * * * *